United States Patent [19]
Fossum et al.

[11] Patent Number: 5,949,483
[45] Date of Patent: Sep. 7, 1999

[54] ACTIVE PIXEL SENSOR ARRAY WITH MULTIRESOLUTION READOUT

[75] Inventors: Eric R. Fossum; Sabrina E. Kemeny, both of La Crescenta; Bedabrata Pain, Los Angeles, all of Calif.

[73] Assignee: California Institute of Technology, Pasadena, Calif.

[21] Appl. No.: 08/785,930

[22] Filed: Jan. 22, 1997

Related U.S. Application Data

[63] Continuation-in-part of application No. 08/558,521, Nov. 16, 1995, which is a continuation of application No. 08/188, 032, Jan. 28, 1994, Pat. No. 5,471,515
[60] Provisional application No. 60/010,305, Jan. 22, 1996, and provisional application No. 60/013,700, Mar. 20, 1996.

[51] Int. Cl.⁶ .................................................. H04N 5/335
[52] U.S. Cl. ........................ 348/303; 348/310; 348/315; 250/208.1
[58] Field of Search ................................. 348/294, 295, 348/302, 303, 304, 307, 308, 309, 310, 311, 315, 316; 250/208.1; H04N 5/335

[56] References Cited

U.S. PATENT DOCUMENTS

| | | | |
|---|---|---|---|
| 4,779,004 | 10/1988 | Tew et al. .................................. | 250/578 |
| 5,196,939 | 3/1993 | Elabad et al. ............................. | 348/314 |
| 5,262,871 | 11/1993 | Wilder et al ............................. | 348/307 |
| 5,327,234 | 7/1994 | Creswick .................................. | 348/399 |
| 5,369,039 | 11/1994 | Hynecek ..................................... | 437/2 |
| 5,440,343 | 8/1995 | Parulski et al. .......................... | 348/316 |
| 5,452,004 | 9/1995 | Roberts ..................................... | 348/301 |
| 5,471,515 | 11/1995 | Fossum et al. ............................ | 377/60 |
| 5,493,335 | 2/1996 | Parulski et al. .......................... | 348/233 |
| 5,659,315 | 8/1997 | Mandl ........................................ | 341/143 |
| 5,717,199 | 2/1998 | Carbone et al. ....................... | 250/208.1 |

OTHER PUBLICATIONS

Fossum et al. Application of the Active Pixel Sensor Concept to Guidance and Navigation, SPIE, vol. 1949 paper 30 (1993).
Mendis et al., Progress in CMOS Active Pixel Image Sensors, SPIE vol. 2172:1–11 (1994).

*Primary Examiner*—Wendy Garber
*Assistant Examiner*—Ngoc-Yen Vu
*Attorney, Agent, or Firm*—Fish & Richardson P.C.

[57] ABSTRACT

An imaging device formed as a monolithic complementary metal oxide semiconductor integrated circuit in an industry standard complementary metal oxide semiconductor process, the integrated circuit including a focal plane array of pixel cells, each one of the cells including a photogate overlying the substrate for accumulating photo-generated charge in an underlying portion of the substrate and a charge coupled device section formed on the substrate adjacent the photogate having a sensing node and at least one charge coupled device stage for transferring charge from the underlying portion of the substrate to the sensing node. There is also a readout circuit, part of which can be disposed at the bottom of each column of cells and be common to all the cells in the column. The imaging device can also include an electronic shutter formed on the substrate adjacent the photogate, and/or a storage section to allow for simultaneous integration. In addition, the imaging device can include a multiresolution imaging circuit to provide images of varying resolution. The multiresolution circuit could also be employed in an array where the photosensitive portion of each pixel cell is a photodiode. This latter embodiment could further be modified to facilitate low light imaging.

22 Claims, 15 Drawing Sheets

ACTIVE PIXEL SENSOR ARRAY WITH MULTIRESOLUTION READOUT

RELATED APPLICATIONS

This application is a continuation-in-part of U.S. patent application Ser. No. 08/558,521 filed Nov. 16, 1995, which is a continuation of Ser. No. 08/188,032 filed Jan. 28, 1994 now U.S. Pat. No. 5,471,515 entitled ACTIVE PIXEL SENSOR WITH INTRA-PIXEL CHARGE TRANSFER by Eric R. Fossum et al. and assigned to the present assignee. This application also claims priority from provisional application number 60/010,305, filed Jan. 22, 1996, and from provisional application number 60/013,700, filed Mar. 20, 1996.

ORIGIN OF THE INVENTION

The invention described herein was made in the performance of work under a NASA contract, and is subject to the provisions of Public Law 96-517 (35 USC 202) in which the Contractor has elected to retain title.

FIELD OF THE INVENTION

The invention is related to semiconductor imaging devices. More specifically, the present invention relates to a silicon imaging device which can be fabricated using a CMOS compatible process, and specific improved techniques that are used by such a system.

BACKGROUND AND SUMMARY

Many semiconductors can be used for acquiring a signal indicative of an image. Charge coupled devices (CCDs), photodiode arrays, charge injection devices and hybrid focal plane arrays are some of the more commonly used devices. CCDs are often used, since they represent a mature technology, are capable of large formats and very small pixel size and they facilitate noise-reduced charge domain processing techniques such as binning and time delay integration.

However, CCD imagers suffer from a number of drawbacks. For example, the signal fidelity of a CCD decreases as the charge transfer efficiency is raised to the power of the number of stages. Since CCDs use many stages, the CCD fabrication technique needs to be optimized for very efficient charge transfer efficiency. CCDs are also susceptible to radiation damage, require good light shielding to avoid smear and have high power dissipation for large arrays.

The specialized CCD semiconductor fabrication process is intended to maximize the charge transfer efficiency of the CCD. This specialized CCD process, however, has been incompatible with the complementary metal oxide semiconductor ("CMOS") processing which has been conventionally used. The image signal processing electronics required for the imager are often fabricated in CMOS. Accordingly, it has been difficult to integrate on-chip signal processing electronics in a CCD imager, because of the incompatibility of the processing techniques. Because of this problem, the signal processing electronics has often been carried out off-chip.

Typically, each column of CCD pixels is transferred to a corresponding cell of a serial output register, whose output is amplified by a single on-chip amplifier (e.g., a source follower transistor) before being processed in off-chip signal processing electronics. This architecture limits the read-out frame rate which the on-chip amplifier can handle proportional to the number of charge packets divided by the number of pixels in the imager.

The other types of imager devices have problems as well. Photodiode arrays exhibit high kTC noise. This makes it impractical to reset a diode or capacitor node to the same initial voltage at the beginning of each integration period. Photodiode arrays also suffer from lag. Charge injection devices also have high noise.

Hybrid focal plane arrays exhibit less noise but are prohibitively expensive for many applications and have relatively small array sizes.

In view of the inventors recognition of the above problems, it is one object of the present invention to provide an imager device which has the low kTC noise level of a CCD without the associated CMOS incompatibility and other above-described problems.

Many imaging applications, including biological vision modeling, stereo range finding, pattern recognition, target tracking, and progressive transmission of compressed images have made use of varying resolution image data. The availability of this data allows the user to obtain a unit, e.g., a frame of data at the lowest resolution necessary for the current task. This may eliminate unnecessary processing steps associated with obtaining a more detailed image. In the past, such multiresolution image data has been generated through an image pyramid approach. The observed scene is imaged at the highest resolution possible for the imager that is used. The next groups of pixel outputs are processed to create a combined output representing a lower resolution frame/image. This lower resolution frame/image is also stored. The process continues until a predetermined number of different resolution levels are obtained. The desired resolution level is then read out.

Many previous attempts used software to rearrange the image content. However, construction of the multiresolution pyramid through software can be a very computationally-intensive and time consuming portion of an image processing task. Many computers will consume on the order of hundreds of milliseconds for a 512×512 pixel array. This requires each resolution level to be individually processed and separately stored. The resulting processing time can make implementation of multiresolution readout in systems where data is required at video rates (e.g., 30 frames per second) difficult. The problem becomes even more severe for image processing tasks performed on large format images (e.g., 1024×1024 pixel arrays) where the output of millions of pixels can be involved.

It is another object of the present invention to provide a multiresolution readout system that can provide image data at a desired resolution and at speeds greater than or equal to the aforementioned video rates.

In view of the above, one aspect of the present invention is embodied in an imaging device formed as a monolithic complementary metal oxide semiconductor integrated circuit in an industry standard complementary metal oxide semiconductor process. The integrated circuit includes a focal plane array of pixel cells, each one of the cells including a photogate overlying the substrate for accumulating photo-generated charge in an underlying portion of the substrate and a charge coupled device section formed on the substrate adjacent the photogate having a sensing node and at least one charge coupled device stage for transferring charge from the underlying portion of the substrate to the sensing node.

In a preferred embodiment, the sensing node of the charge coupled device section includes a floating diffusion, and the charge coupled device stage includes a transfer gate overlying the substrate between the floating diffusion and the photogate. This preferred embodiment can further include apparatus for periodically resetting a potential of the sensing node to a predetermined potential, including a drain diffusion connected to a drain bias voltage and a reset gate between the floating diffusion and the drain diffusion, the reset gate connected to a reset control signal.

The imaging device also includes a readout circuit having at least an output transistor. Preferably, the output transistor is a field effect source follower output transistor formed in each one of the pixel cells, the floating diffusion being connected to its gate. Also, the readout circuit can further include a field effect load transistor connected to the source follower output transistor, and preferably a correlated double sampling circuit having an input node connected between the source follower output transistor and load transistor. The focal array of cells is also preferably organized by rows and columns, and the readout circuit has plural load transistors and plural correlated double sampling circuits. In this case, each cell in each column of cells is connected to a single common load transistor and a single common correlated double sampling circuit. These common load transistors and correlated double sampling circuits are disposed at the bottom of the respective columns of cells to which they are connected.

In the preferred implementation, charge is first accumulated under the image acquisition element of a pixel cell. That image acquisition element can be a photogate of an active pixel cell, an active photodiode, either of which can operate in either current or voltage mode. For simplicity, the image acquisition element will be referred to herein as a photogate, and with reference to a photogate. It should be understood that use of a photodiode will have certain differences from the photogate operation. The photodiode requires to transfer gate or photogate. The floating diffusion is therefore correspondingly larger. Also, the information is read out in reverse order—charge first, then reset level. This double sampling operation is therefore not correlated, and hence does not compensate for kTC noise.

Returning to the description of the preferred photogate mode, the correlated double sampling circuit samples the floating diffusion immediately after it has been reset, at one capacitor. The accumulated charge is then transferred to the floating diffusion and the sampling process is repeated with the result stored at another capacitor. The difference between the two capacitors is the signal output. In accordance with a further refinement, this difference is corrected for fixed pattern noise by subtracting from it another difference sensed between the two capacitors while they are temporarily shorted.

The imaging device can also have a micro-lens layer overlying the substrate. This micro-lens layer includes a refractive layer and individual lenses formed in the layer which are in registration with individual ones of the cells. Each of the individual lenses has a curvature for focusing light toward a photosensitive portion of the respective cell.

The aforementioned pixel cell structure can also be advantageously modified to allow the simultaneous integration of the array, thereby providing a "snapshot" image. The modification entails adding a storage gate which overlies the substrate and is capable of storing the accumulated photo-generated charge in an adjacent underlying portion of the substrate. In addition, the charge coupled device section has an additional charge coupled device stage which in combination with the original stage transfers charge from the portion of the substrate underlying the photogate to said sensing node. This additional stage includes an intermediate transfer gate disposed between the photogate and the storage gate. In operation, charge accumulated under the photogate is transferred to the portion of the substrate under the storage gate via the action of the intermediate transfer gate. The charge is then transferred to the floating diffusion via the action of the transfer gate only during readout. In this way, the entire array (or part thereof) can be integrated simultaneously and the accumulated charge stored until it is to be read out.

Any of the above-described arrays, or a photodiode array, can be also modified to incorporate a multiresolution imaging capability. This has been done by using a multiresolution circuit which is connected to each of the pixel cells. The multiresolution circuit processes the image signal output from each one of a group of cells forming a contiguous block within the array. The new blocks within the array form the new pixels of the new resolution image.

More specifically, the multiresolution circuit preferably averages the image signals output from the cells forming a block, to produce a block average output. This block average output represents a lower resolution image signal.

An important advantage of a block averaging process which produces a lower resolution image is reduced processing time. Noise reduction techniques are also possible. A block averaging process can be performed by the multiresolution circuit on the signals output by the pixel cell just after being reset, as well as on the signals output after the photo-generated charge has been accumulated and transferred. The two block averages, i.e., the block reset average and the block signal average, are then differentially compared to produce a reduced noise output signal. The multiresolution circuit can also be configured to average the aforementioned block averages over time. In this case, the image signal output by the pixel cells uses a succession of discrete image readouts, where each readout represents the scene viewed by the image device at a different time. The block averages produced following each readout are averaged for a prescribed number of iterations to produce the temporal block average.

The multiresolution circuit described above could also be used in an array where the actively photosensitive portion of each pixel cell is a photodiode.

An alternate version of the multiresolution circuitry is used to interconnect groups of the photodiodes forming an array to form contiguous blocks within the array, and output the block averages. Additionally, if such an array is used, it could be further modified to facilitate low light imaging. Specifically, the modified photodiode array would have pixel cells which include a photodiode, a floating diffusion, a readout circuit means connected to the floating diffusion, and a transfer gate between said floating diffusion and the photodiode. The multiresolution circuit would still be used to form blocks. However, the block would be read out via the floating diffusion of just one of the cells within a block. This enhances the output signal and allows low light imaging.

In addition to the previously-described benefits, other objectives and advantages of the present invention will become apparent from the detailed description which follows hereinafter when taken in conjunction with the drawing figures.

BRIEF DESCRIPTION OF THE DRAWINGS

These and other aspects of the invention will now be described in detail with reference to the accompanying drawings, wherein.

DETAILED DESCRIPTION OF THE PREFERRED EMBODIMENTS

Figure 1:
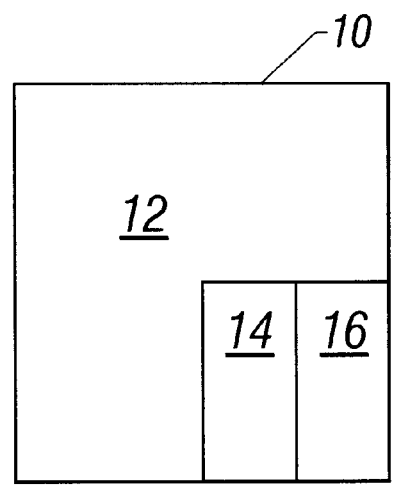
FIG. 1 is a diagram illustrating the architecture of a preferred individual focal plane cell.
Figure 2:
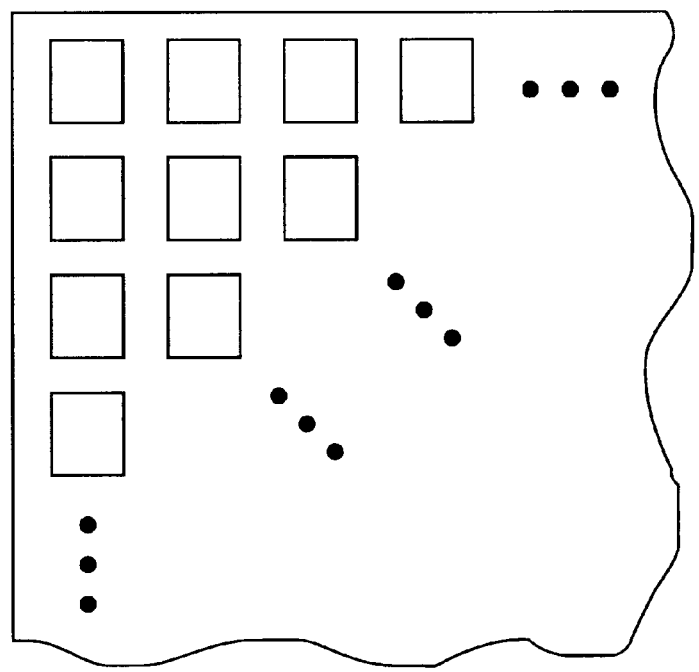
FIG. 2 is a plan view of an integrated circuit having a focal plane array of cells of the type illustrated in FIG. 1.

FIG. 1 is a simplified block diagram of one pixel cell 10 of a focal plane array of many such cells formed in an integrated circuit. Each cell 10 includes a photogate 12, a charge transfer section 14 adjacent the photogate 12 and a readout circuit 16 adjacent the charge transfer section 14. FIG. 2 shows a focal plane array of many cells 10 formed on a silicon substrate 20.

Figure 3A:
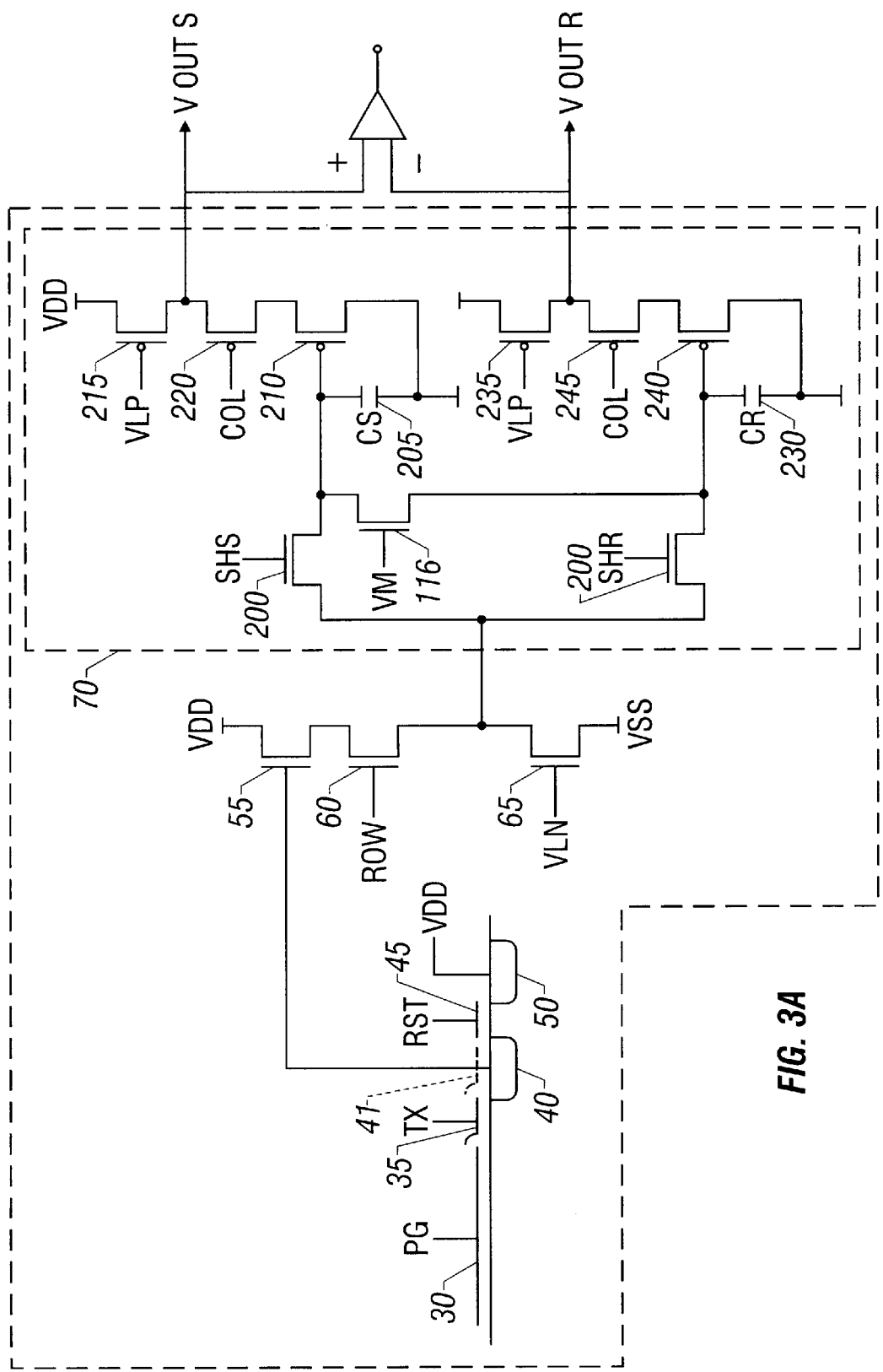
FIG. 3A is a schematic diagram of the cell of FIG. 1.

FIG. 3A is a simplified schematic diagram of a cell 10 and its associated processing. Each pixel 300 includes a photogate area and its associated circuitry (30–50) and row decoder elements 55,60. FIG. 3A shows the photogate 12 having a relatively large photogate electrode 30 overlying the substrate. The charge transfer section 14 has a transfer gate electrode 35 adjacent the photogate electrode 30, a floating diffusion 40, a reset electrode 45 and a drain diffusion 50. The readout circuit 16 has a source follower field effect transistor (FET) 55, a row select FET 60, a load FET 65 and a correlated double sampling circuit 70.

Figure 4:
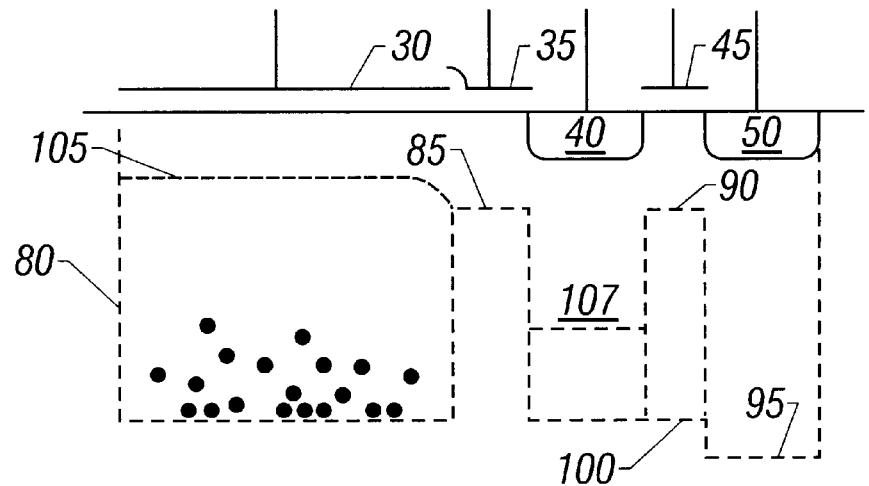
FIG. 4 is a graph of the surface potential in the charge transfer section of the cell of FIG. 3A

The surface potential diagram of FIG. 4 shows the photogate electrode 30 being held by a photogate signal PG at a positive voltage to form a potential well 80 in the substrate 20 in which photo-generated charge is accumulated during an integration period. The transfer gate electrode 35 is initially held at a less positive voltage by a transfer gate signal TX to form a potential barrier 85 adjacent the potential well 80. The floating diffusion 40 is connected to the gate of the source follower FET 55 whose drain is connected to a drain supply voltage VDD. The reset electrode 45 is initially held by a reset signal RST at a voltage corresponding to the voltage on the transfer gate 30 to form a potential barrier 90 thereunder. The drain supply voltage VDD connected to the drain diffusion 50 creates a constant potential well 95 underneath the drain diffusion 50.

During the integration period, electrons accumulate in the potential well 80 in proportion to photon flux incident on the substrate 20 beneath the photogate electrode 30. At the end of the integration period, the surface potential beneath the floating diffusion 40 is quickly reset to a potential level 100 slightly above the potential well 95. This is accomplished by the reset signal RST temporarily increasing to a higher positive voltage to temporarily remove the potential barrier 90 and provide a downward potential staircase from the transfer gate potential barrier 85 to the drain diffusion potential well 95, as indicated in the drawing of FIG. 4. After the reset gate 45 is returned to its initial potential (restoring the potential barrier 90), the readout circuit 70 briefly samples the potential of the floating diffusion 40, and then the cell 10 is ready to transfer the photo-generated charge from beneath the photogate electrode 30. For this purpose, the photogate signal PG decreases to a less positive voltage to form a potential barrier 105 beneath the photogate electrode 30 and thereby provide a downward staircase surface potential from the photogate electrode 30 to the potential well 100 beneath the floating diffusion 40. This operation transfers the charge from beneath the photogate electrode 30 to the floating diffusion 40, changing the potential of the floating diffusion 40 from the level (100) at which it was previously reset to a new level 107 indicative of the amount of charge accumulated during the integration period. This new potential of the floating diffusion 40 is sensed at the source of the source follower FET 55. However, before the readout circuit 70 samples the source of the source follower FET 55, the photogate signal PG returns to its initial (more positive) voltage. The entire process is repeated for the next integration period.

The readout circuit 70 has a signal sample and hold (S/H) circuit including an S/H FET 200 and a signal store capacitor 205 connected through the S/H FET 200 and through the row select FET 60 to the source of the source follower FET 55. The other side of the capacitor 205 is connected to a source bias voltage VSS. The one side of the capacitor 205 is also connected to the gate of an output FET 210. The drain of the output FET is a connected through a column select FET 220 to a signal sample output node VOUTS and through a load FET 215 to the drain voltage VDD. A signal called "signal sample and hold" (SHS) briefly turns on the S/H FET 200 after the charge accumulated beneath the photogate electrode 30 has been transferred to the floating diffusion 40, so that the capacitor 205 stores the source voltage of the source follower FET 55 indicating the amount of charge previously accumulated beneath the photogate electrode 30.

The readout circuit 70 also has a reset sample and hold (S/H) circuit including an S/H FET 225 and a signal store capacitor 230 connected through the S/H FET 225 and through the row select FET 60 to the source of the source follower FET 55. The other side of the capacitor 230 is connected to the source bias voltage VSS. The one side of the capacitor 230 is also connected to the gate of an output FET 240. The drain of the output FET 240 is connected through a column select FET 245 to a reset sample output node VOUTR and through a load FET 235 to the drain voltage VDD. A signal called "reset sample and hold" (SHR) briefly turns on the S/H FET 225 immediately after the reset signal RST has caused the resetting of the potential of the floating diffusion 40, so that the capacitor 230 stores the voltage to which the floating diffusion has been reset.

The readout circuit provides a special form of correlated double sampling of the potential of the floating diffusion, allowing the charge integrated beneath the photogate 12 during each integration period to be obtained at the end of each integration period from the difference between the voltages at the output nodes VOUTS and VOUTR of the readout circuit 70. This minimizes the effects of kTC noise because the difference between VOUTS and VOUTR is independent of any variation in the reset voltage RST.

Figure 5:
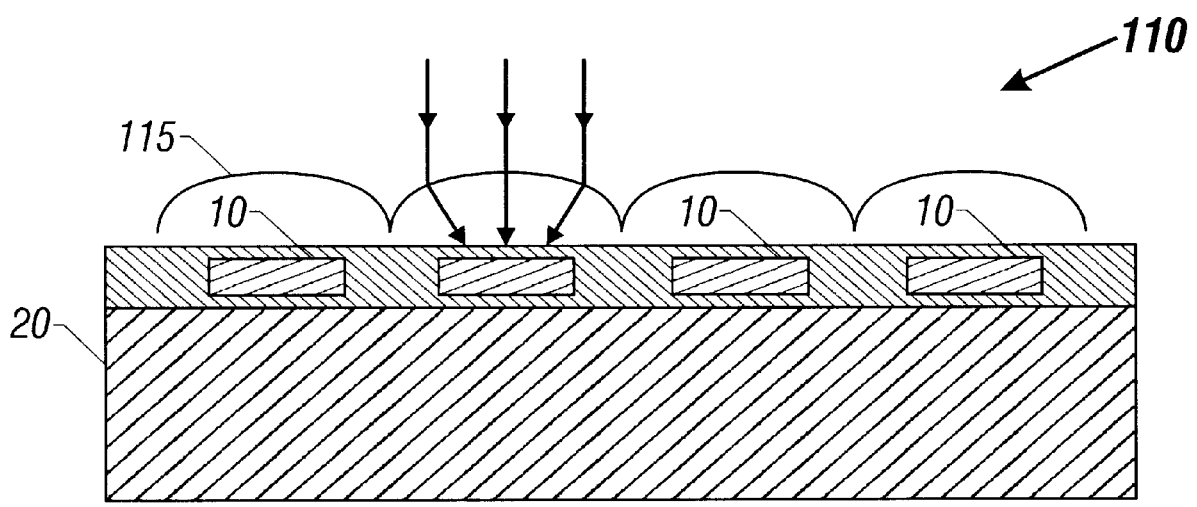
FIG. 5 is a cross-sectional view of an alternative embodiment of the focal plane array of FIG. 2 including a microlens layer.

FIG. 5 shows a transparent refractive microlens layer 110 which may be deposited over the top of the focal plane array of FIG. 2. The microlens layer 110 has spherical portions 115 centered over each of the cells 10 and contoured so as to focus light toward the center of each photogate 12. This has the advantage of using light that would otherwise fall outside of the optically active region of the photogate 12. For example, at least some of the light that is ordinarily incident on either the charge transfer section 14 or the readout circuit 16 (FIG. 1) would be sensed in the photogate area with the addition of the microlens layer 110. This has the effect of maximizing real estate—the portions of the substrate which include the non-photogate area are focused to another point.

Figure 5A:
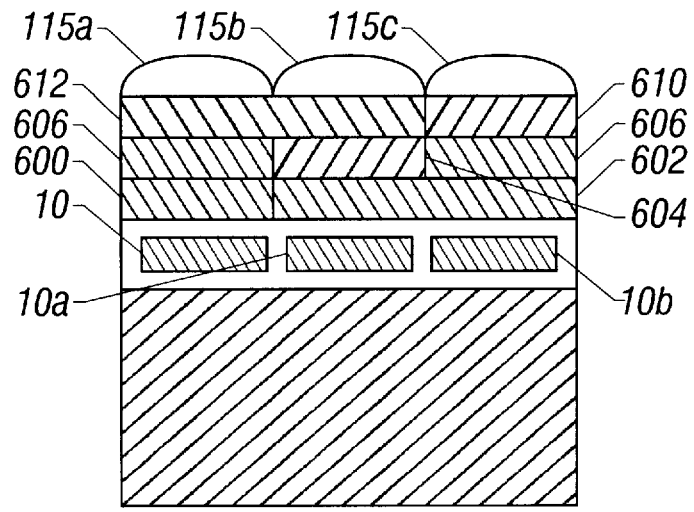
FIG. 5A shows a polymer filter embodiment.
Figure 5B:
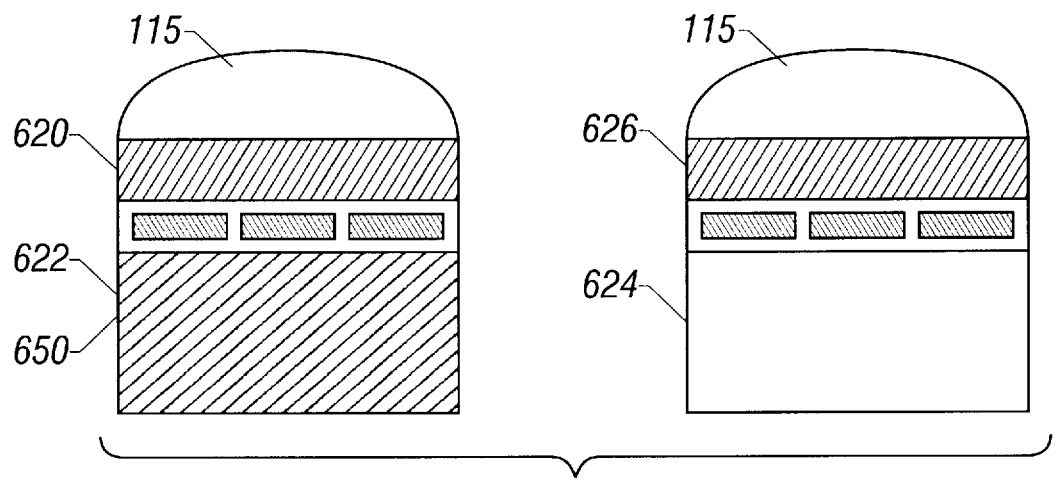
FIG. 5B shows a phosphor embodiment.

FIGS. 5A and 5B show an alternative embodiment of the invention which uses color filtering. Color filtering enables spatial separation of color in an imaging device. CCD devices, for example, commonly use kind of color separation in this way.

The preferred system allows a plurality of pixels to have different color filtering properties to provide a color filtering effect. Typically this is done by using the color filters in some array form: For example, alternate green filters interspersed with red and blue filters. An exemplary filter operation would use green/red/green/blue/green/red/green/blue with that pattern continuing for the length of the array.

According to this embodiment of the present invention, color filters are used to supplement the lens operation of FIG. 5.

The preferred system embodies its operation in one of the two forms shown in FIGS. 5A and 5B. The first form shown in FIG. 5A uses a polymer color filter array. Such polymer color filter arrays are well-known in the art. Layer 600 is preferably a red layer, and is first deposited over the entire chip. Subsequent to deposition, an etching technique is used to remove the red filter area 600 from everywhere except over the desired pixel 10. A planarization layer 602 covers the removed areas to thereby planarize that surface, thereby flattening the surface. Blue filter 604 is next deposited over pixel 10A. Blue filter 604 is similarly etched such that it only covers the desired pixel 10A. The remaining area is planarized by a second planarization layer 606. Finally, a green filter 610 is formed over that planarized layer, covering pixel 10B. Planarization layer 612 flattens the resulting area so that green filter 610 only covers the pixel 10B.

Each pixel, including the polymer layer, is covered by microlens 115A; 115B and 115C. The microlenses modify the incoming light in conjunction with the polymer layer. The light is therefore changed by both microlenses 115A–115C and CFA parts 612, 606, and 600. Each pixel, therefore, preferably receives light that has been altered by the lens and altered by the color filter array.

This polymer color filter array sacrifices a certain amount of resolution of the scene. Each pixel of the scene is imaged by three pixels, and hence some of the pixels are dedicated to a different color.

An alternative embodiment shown in FIG. 5B does not lose resolution, but instead requires multiple chips to form any image. This would form a 3-chip camera. One chip 660 has all its pixels covered by a red filter 620. Hence that chip images the red scene—either the red components or the complement to the red components. Analogously, the other chips include green filters and blue filters. The three chips together form the entire image.

Figure 5C:
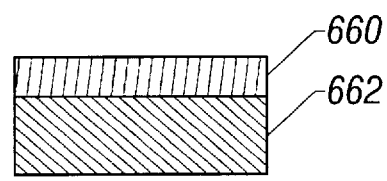
FIG. 5C shows another phosphor embodiment.

Yet another embodiment uses a wavelength-converting phosphor 650 as shown in FIG. 5C. A wavelength-converting phosphor is typically tuned to accept radiation of a desired wavelength, e.g., ultra-violet or x-ray. Typically the silicon underlayer is not responsive to that same wavelength. Therefore, the phosphor emits a photon of the proper type to properly excite the underlying silicon 652, when receiving this radiation. A preferred example is that the phosphor 650 is sensitive to x-ray, but emits a photon of green light that is detected by the circuitry 652 which can be a sensor of any of the kinds described herein.

While the FIG. 5C embodiment contemplates using the wavelength-converting phosphor over an entire surface of the device, it is also possible to use a pixelation effect. A shadow mask is used to mask the phosphor. The phosphor is only deposited where allowed by the shadow mask.

It should also be understood that these same techniques could be embodied in other focal plane and photodiode applications, and that the above color filter array is not limited to single readout circuit per pixel systems.

Preferably, the focal plane array corresponding to FIGS. 1–4 is implemented in MOS silicon or CMOS, or any other technology which is compatible with an industry standard CMOS fabrication process. Preferably, each of the FETs is a MOSFET, the FETs 55, 60, 65, 200 and 225 being n-channel devices and the FETs 210, 220, 225, 230, 240, 245 being p-channel devices. The n-channel MOSFETS and the CCD channel underlying the gate electrodes 30, 35, 45 and the diffusions 40 and 50 may be located in a p-well while the remaining (p-channel) devices are located outside of the p-well. The gate voltage VLP applied to the gates of the p-channel load FETs 215 and 235 is a constant voltage on the order of +2.5 volts. The gate voltage VLN applied to the n-channel load FET 65 is a constant voltage on the order of +1.5 volts.

The charge transfer section 14 preferably uses only a single CCD stage between the photogate 12 and the floating diffusion 40 in the specific embodiment of FIG. 3A. This means that there is no loss due to charge transfer inefficiency and therefore there is no need to fabricate the device with a special CCD process. As a result, the readout circuit 70 as well as the output circuitry of the FETs 55, 60 and 65 can be readily implemented as standard CMOS circuits, making them relatively inexpensive. However, any suitable charge coupled device architecture may be employed to implement the charge transfer section 14, including a CCD having more than one stage. For example, two or three stages may be useful for buffering two or three integration periods.

Other implementations of the concept of the invention may be readily constructed by the skilled worker in light of the foregoing disclosure. For example, the floating diffusion 40 may instead be a floating gate electrode. The signal and reset sample and hold circuits of the readout circuit 70 may be any suitable sample and hold circuits. Moreover, shielding of the type well-known in the art may be employed defining an aperture surrounding the photogate 12. Also, the invention may be implemented as a buried channel, n-well, or p-channel device.

Another feature of the invention which is useful for eliminating fixed pattern noise due to variations in FET threshold voltage across the substrate 20 is a shorting FET 116 across the sampling capacitors 205, 235. After the accumulated charge has been measured as the potential difference between the two output nodes VOUTS and VOUTR, a shorting signal VM is temporarily applied to the gate of the shorting FET 116 and the VOUTS-to-VOUTR difference is measured again. This latter difference is a measure of the disparity between the threshold voltages of the output FETs 210, 240, and may be referred to as the fixed pattern difference. The fixed pattern difference is subtracted from the difference between VOUTS and VOUTR measured at the end of the integration period, to remove fixed pattern noise.

As previously mentioned herein, a floating gate may be used instead of the floating diffusion 40. Such a floating gate is indicated schematically in FIG. 3A by a simplified dashed line floating gate electrode 41. In one preferred implementation, the area of the L-shaped photogate 12 (i.e., the photogate electrode 30) was about 100 square microns; the transfer gate electrode 35 and the reset gate electrode were each about 1.5 microns by about 6 microns; the photogate signal PG was varied between about +5 volts (its more positive voltage) and about 0 volts (its less positive voltage; the transfer gate signal TX was about +2.5 volts; the reset signal RST was varied between about +5 volts (its more positive voltage) and about +2.5 volts (its less positive voltage); the drain diffusion 50 was held at about +5 volts.

The array structure of FIGS. 1–4 can be modified to incorporate a preferred column parallel approach. The term column parallel approach refers to a portion of the readout circuitry being connected to the bottom on the columns of the array. This allows an entire row of the array to be processed at one time. This column approach is in contrast to a spatially parallel processing approach where each pixel has its own processing circuitry (e.g., the embodiment of FIGS. 1–4), or a serial processing approach where the output of each pixel is sequentially feed to a single processor for processing.

Figure 3B:
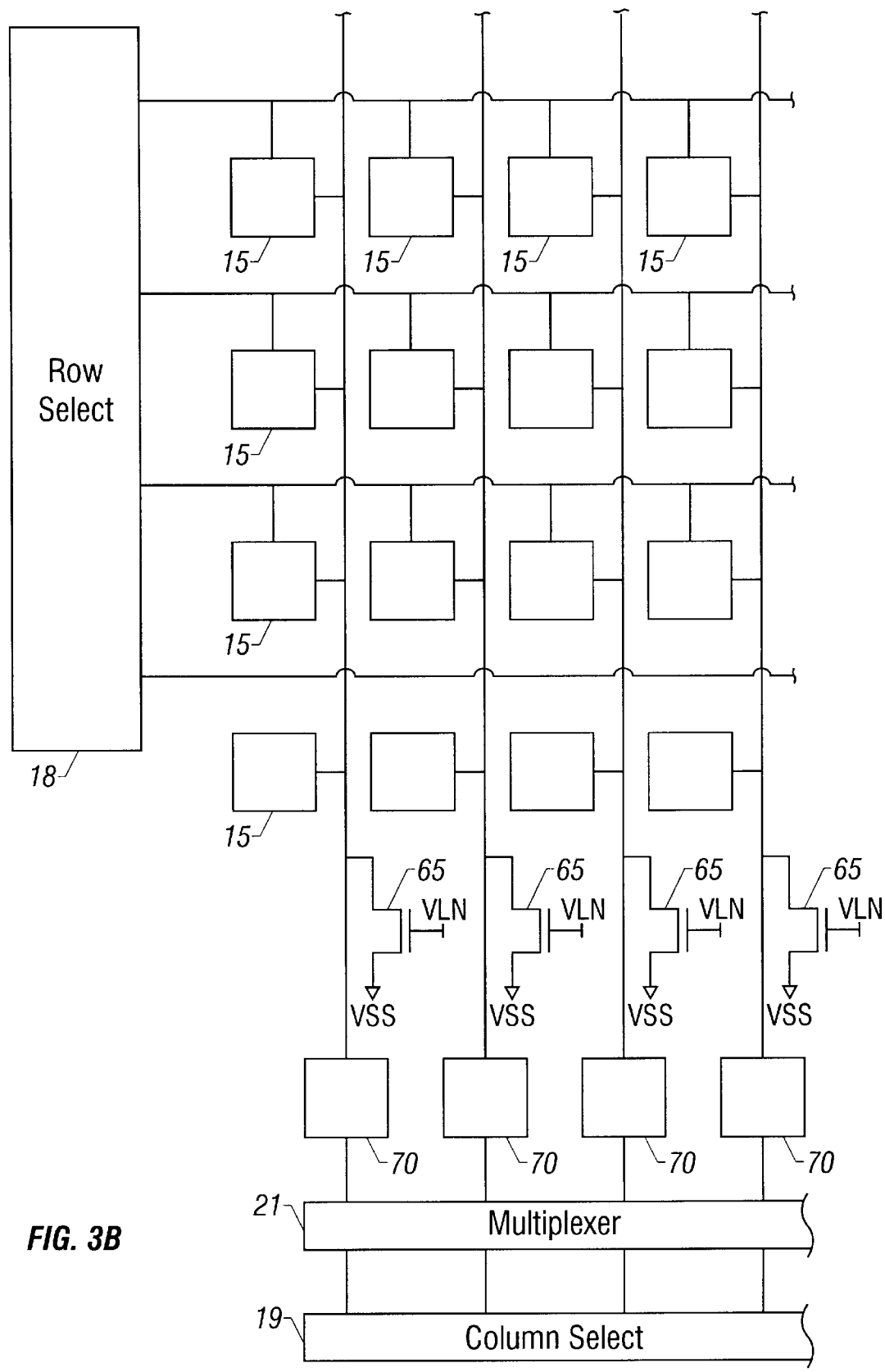
FIG. 3B is a plan view of an integrated circuit constituting a focal plane array of cells of a type similar to FIG. 1, but wherein the load FET and sampling circuit is deleted from each cell and incorporated as common elements at the bottom of each array column.

FIG. 3B shows a column parallel approach where the load FET 65 and correlated double sampling circuit 70 are deleted from the individual pixel cells 10. Instead, each cell 10 in a column of the array is connected to a common load FET 65 and sampling circuit 70. The common elements are preferably located at the bottom of each column of the array. This column parallel array structure has a significant advantage. Since the load FET 65 and sampling circuit 70 have been removed from the pixel cells 10, there is more photo-sensitive cell area available. Thus, the resolution of each cell 10 is improved. The column parallel array structure is read out by selecting an entire row using standard row and column select circuitry 18, 19. Selecting a row, among other things, results in the accumulated charge being transferred from the photogate potential well 80 of each cell 10 in the row to its associated floating diffusion 40. Thereafter, the sampling circuits 70 at the bottom of each column "read" the connected pixel cell 10 in the manner described previously. A standard multiplexer 21 is then employed to output the "read" pixel cell values, either in parallel or serially.

A preferred embodiment of the active pixel sensor array allows multiresolution readout of image data. This system describes a hardware implementation of a system which can read out image data at a user-defined resolution within video frame rates operated by building up and storing an entire image pyramid. A resolution among the stores resolutions. The present invention goes against this established teaching. According to this embodiment, the imager itself is configured, and read out directly at the desired resolution.

The present technique uses a block averaging approach in which a local average of a block of pixels is taken to create a lower resolution superpixel. The intensity of the output from this "superpixel" is an average of the intensities of all the pixels within a selected block. The pixel blocks can generally be of any size and shape, and located anywhere within the array.

For example, a 36×36=576 pixel array could be divided into nine square superpixels, each made up of 12×12=144 pixel blocks. The output of each pixel within a superpixel block is averaged together to form a single output for the entire block. Each superpixel has the result of 144 pixels therein; hence this produces an image having a resolution that is 144 times less than the resolution from the readout from each individual pixel processed separately. Moreover, only nine data points (i.e., one from each superpixel) need to be processed, instead of the 576 data points required if the output from each pixel were processed. This results in a tremendous savings in processing time. In some instances, a lower resolution image such as that described above may be adequate for the necessary. In addition, even if a higher resolution is ultimately required, a lower resolution readout may be adequate to identify the specific areas in the overall image which are of interest. In such a case, this technique is used to process image data solely from pixels within the area of interest. Here again, the image signal from each individual pixel need not be processed; the averaged output of pixel blocks within the window is used instead. Thus, if a resolution less than the maximum possible from the imager is adequate, the processing time can be reduced once again. The lower resolution image data can be used to further identify an area of interest within the window to be imaged at a higher resolution.

Figure 6A:
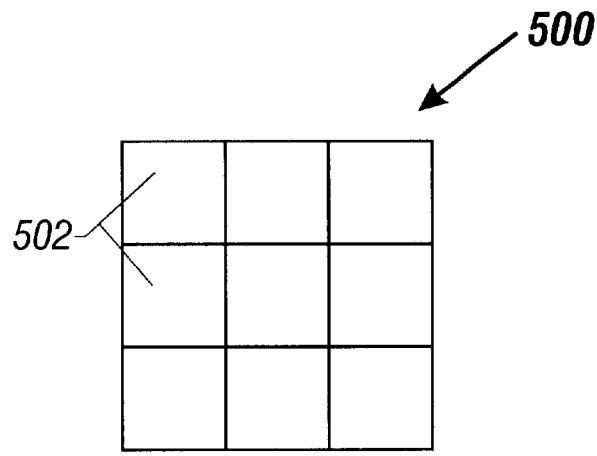
FIGS. 6A, 6B and 6C are illustrations of various blocking schemes in an array employing multiresolution imaging in accordance with the present invention.
Figure 6B:
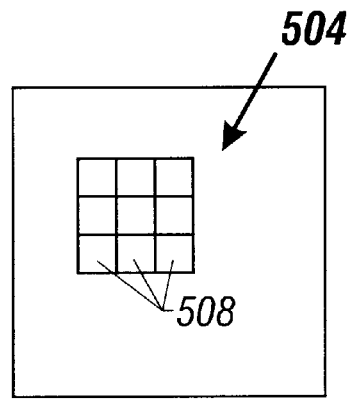
Figure 6C:
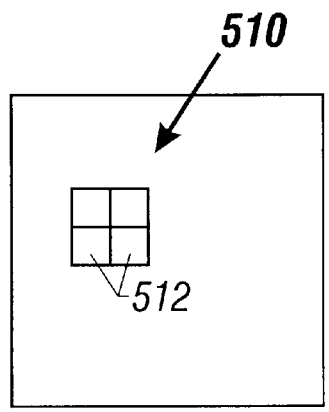

FIGS. 6A–6C provide an example of this operation. FIG. 6A shows a 36×36 pixel array 500 which is block-averaged into nine 12×12 superpixels 502. An area of interest in the upper left quadrant is identified from the lower resolution image data obtained thereby. This area of interest can then be further identified. FIG. 6B shows this area of interest 504 covering approximately a 12×12 pixel region of the array 500. This area 504 has been block-averaged into nine sub-superpixels 508, each having a 4×4 pixel block. The intermediate resolution image data provided by the imager depicted in FIG. 6B is used to identify a further area of interest 510. This area 510 is imaged, as shown in FIG. 6C, at the highest resolution possible using the 2×2 array of pixels 512. The term "highest resolution" here means that the readout from each individual pixel in the area of interest is processed, as opposed to block averaged.

Figure 7:
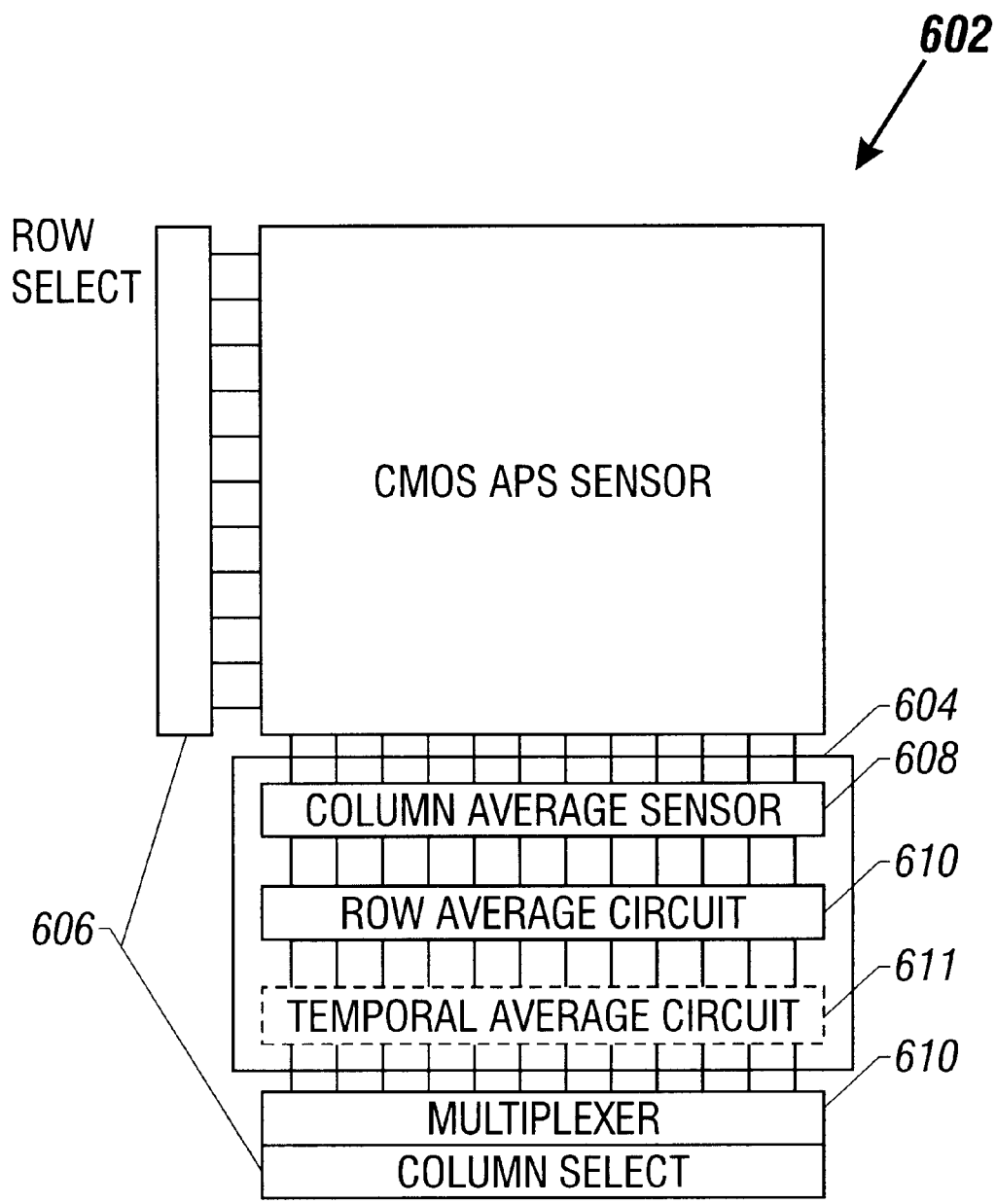
FIG. 7 is a diagram illustrating the architecture of an integrated circuit constituting a focal plane array with multiresolution imaging capability and employing a column parallel approach.

One preferred architecture for the above-described multiresolution active pixel sensor array is shown in FIG. 7. This architecture uses the previously-discussed column parallel approach. A 2-D array 602 of active pixel sensors include multiresolution readout circuitry 604 located at a portion of the array—e.g., the bottom of the array as shown in FIG. 7. Here, the term column parallel approach is based on the multiresolution circuitry 604 being connected to the bottom on the columns of the array 602. This configuration allows an entire row of the array 602 to be processed at one time, as will be discussed below.

The column parallel approach accesses each pixel in the array 602 through conventional row and column selection circuitry 606. The row and column selection circuitry 606 switches the outputs from a row of the array 602, or a portion thereof, to the multiresolution circuitry 604 connected at the bottom of each column. The multiresolution readout circuitry 604 includes a column averaging section 608 connected to the array 602 and a row averaging section 610 connected to the column averaging section 608.

Figure 8:
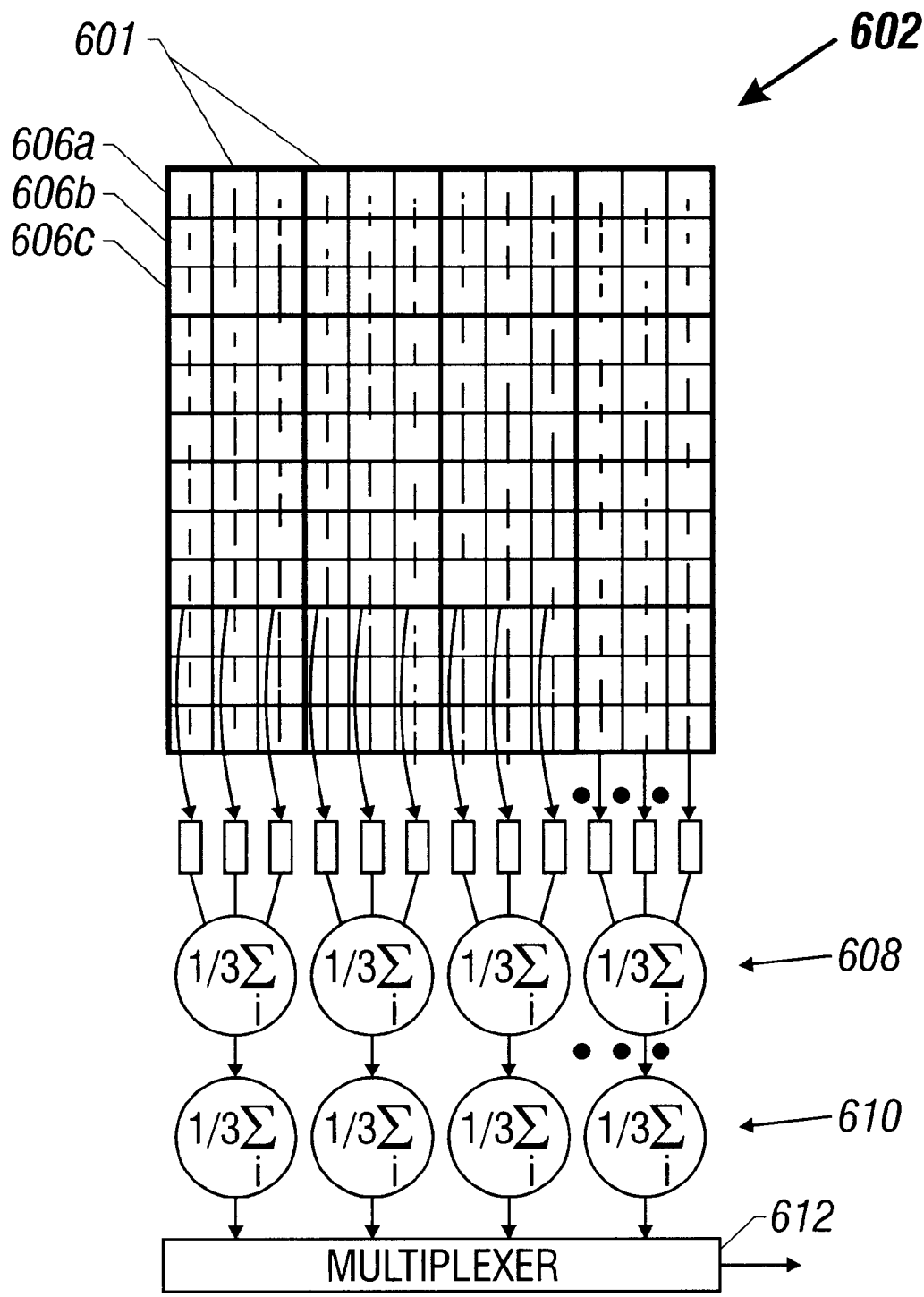
FIG. 8 is a diagram illustrating the downsampling of the array of FIG. 7 by a factor of three.

The preferred structure that is used to average the outputs of a block of pixels in the array 602 is shown in FIG. 8. The following assumes an example in which the array 602 is to be divided into a series of adjacent 3×3 pixel blocks 603. A first row of pixels 606a is read out and every three pixels grouped is averaged together in the column averaging circuit 608. These 3-pixel averages are stored in the row averaging section 610. This process is repeated from the next two consecutive rows 606b, 606c to get a total of three rows of information now stored in the row averaging circuit.

The row averaging section 610 calculates and outputs an average of the three inputs for each block. This average, therefore, is an average readout for each of the 3×3 blocks for the first three rows 606a–c. The output of the row averaging section 610 is received by a conventional multiplexer 612 which can either provide a serial or parallel readout, as desired.

The above-described block averaging process is then repeated for the next three rows of the array, until the entire array has been block-averaged. It should be noted that the entire array need not be block averaged. As will become apparent in the later discussion of circuit implementation of this general architecture, a portion of the array can be block averaged exclusive of the rest of the array by foregoing the averaging of some of the pixels in a row. For instance, in the above example, if the processing were limited to the first three pixels of the first three rows, only the 3×3 block in the upper right-hand corner of the array would be averaged and readout. This provides a programmable windowing capability.

A temporal averaging section 611 may be optionally connected between the row averaging section 610 and the multiplexer 612. In operation, the output from the row averaging section 610 representing the aforementioned block averages for a particular iteration of the image readout from the pixel array 602 are stored in the temporal averaging section 611. Thereafter, additional outputs associated with a predetermined number of iterations are stored and averaged. Finally, the temporally-averaged block values are transferred to the multiplexer 612. The number of iterations averaged depends on the frame rate expected from the imager.

For instance, assume the total processing time to obtain the block-averaged values from the row averaging section 610 is approximately 15 ms and the desired frame rate is about 30 ms. These two subsequent frames may be averaged by the temporal averaging section 611 before outputting to the multiplexer 612. While this still provides image data at the expected frame rate, temporal averaging of the image data from the array 602 can be used advantageously, for example, in an event detection application. If the observed scene is changing very slowly, for example, there may not be enough difference between the image output in one iteration and the next to determine that an event has occurred. However, averaging of multiple iterations allow a more accurate comparison to a subsequent, similarly averaged output.

The multiresolution readout circuitry architecture described above can be implemented in a variety of ways. Two preferred approaches will now be discussed. Both preferably locate the multiresolution readout circuitry at the bottom of the array columns and access it through a set of programmable switches. Any well-known programmable switching network can be used for this switching.

Figure 9:
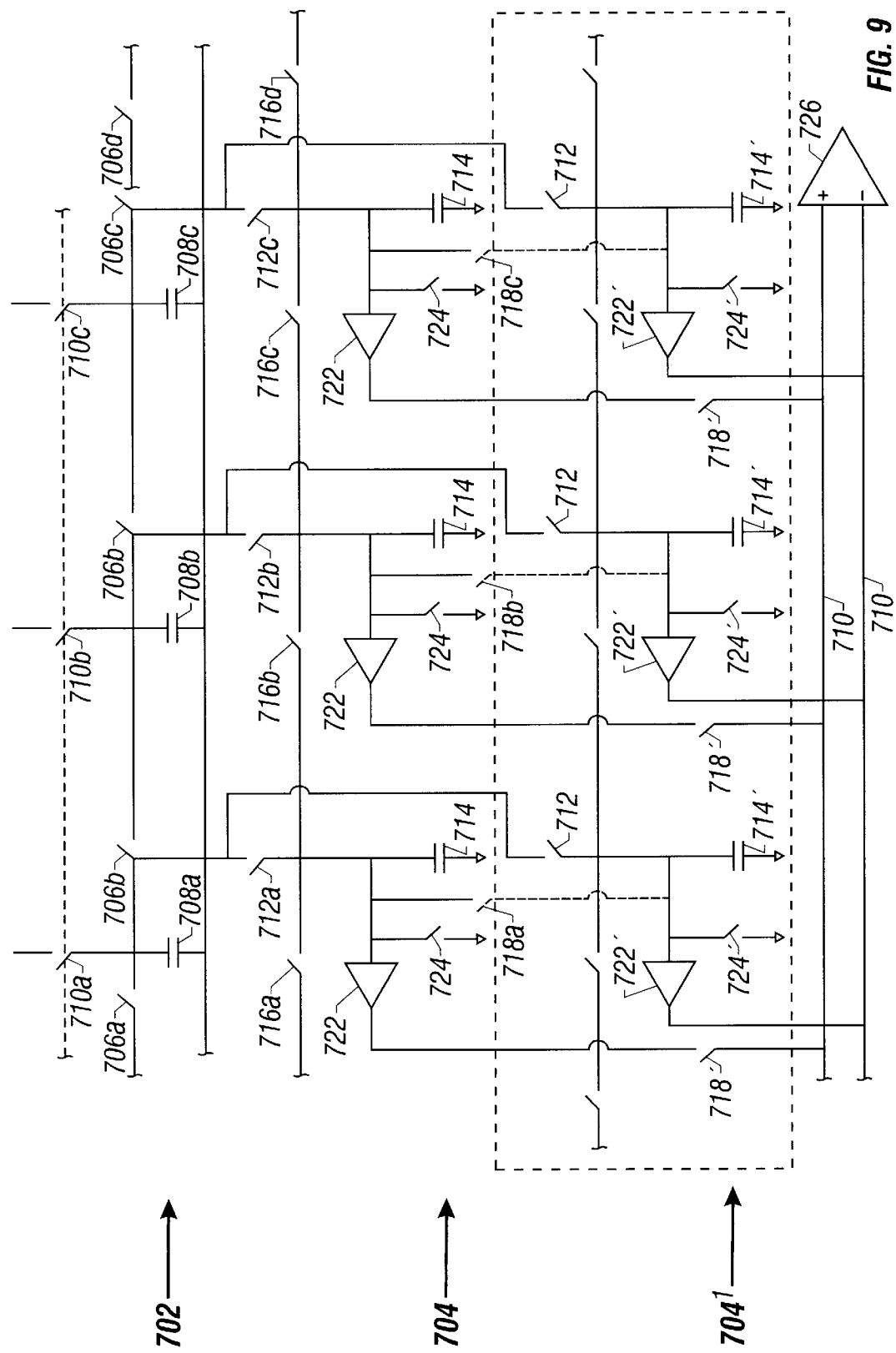
FIG. 9 is a schematic diagram of one embodiment of the multiresolution imaging circuit associated with the architecture of FIG. 7.

A first implementation uses a passive capacitor approach shown schematically in FIG. 9. Two capacitor banks 702, 704 are interconnected through a set of programmable switches to perform signal averaging. The first bank 702 corresponds to the previously described column averaging section 608, while the second bank 704 corresponds to the row averaging section 610. All capacitors in both banks 702, 704 preferably have the same capacitance value. For example, 3 pf capacitors were employed in a tested embodiment, but more preferably, the capacitance value is in a range from 1 to 10 pf. The third capacitor bank 705', shown in the dashed-line box in FIG. 9, is the optional capacitor bank for the temporal averaging 611 circuit. Capacitors as described herein include either linear double poly capacitor or linear MOS capacitors or regular MOS capacitors.

The operation of this circuit will now be explained by stepping through the process for averaging a 3×3 block. The first and fourth column averaging section switches 706a and 706d are open (i.e., deselected), while the other switches 706b and 706c are closed (i.e., selected). Signals output by three pixels of the array corresponding to the first row of the block to be averaged are sampled onto the column averaging section capacitors 708a, 708b, and 708c by globally pulsing (i.e., briefly closing and then opening) the signal select switches 710a, 710b, and 710c. These lines have been switched to the outputs of the aforementioned pixels. This causes the three column averaging section capacitors 708a, 708b, and 708c shown to be charged. Since the capacitors 708a, 708b, and 708c are connected together by the closed column averaging section switches 706b and 706c, the charge redistributes such that the voltage on each capacitor 708 is substantially the same. Next, the first row selection switch 712a is closed, thereby causing the three column averaging capacitors 708a, 708b, and 708c to charge the first row averaging capacitor 714a. All the other row selection switches 712b and 712c remain open during this transfer. The process is then repeated for the second row of the block being averaged. However, this time the second row selection switch 712b is closed while the others remain open. This charges the second row averaging capacitor 714b with those values. Finally, the process is repeated for the third row of the block, with the third row averaging capacitor 714c being charged by closing the third row selection switch 712c. After all three of the row averaging capacitors 714a, 714b, and 714c have been individually charged, the charge is redistributed by pulsing the row averaging switches 716a, 716b, 716c, and 716d in the same pattern as the column averaging switches, i.e., the first 716a and fourth 716d are left open, while the second 716b and third 716c are toggled. This equalizes the charge between the row averaging capacitors 714a, 714b, and 714c, such that the voltage on each capacitor 714 represents the average of the voltages originally placed on the individual capacitors 714. Therefore, the charge on the capacitors 714 is an amount representative of the block average. The block average is read out to either a multiplexer, or a temporal averaging section (if used), by pulsing the output switch 718a, 718b, and 718c of any one of the three row averaging section capacitors 714.

The charge in row averaging capacitors 714 is buffered from the output line 720 by buffers 722, such as a source-follower output amplifier, to prevent any possible loading from the output line 720. Charge sharing between the column and row averaging capacitors 708a, 708b, and 708c, 714a, 714b, and 714c during the charge transfer step can be avoided by followers, but more preferably, a constant factor of ½ is applied to the readout from the row averaging section 704 to obtain a true average voltage for the 3×3 block. This same factor would apply to any size block being averaged.

The row averaging capacitors 714 are reset by globally pulsing the row averaging reset switches 724. The column and row averaging sections 702, 704 are then ready to average another block or blocks. It is noted that there is no need to reset the column averaging capacitors 708, like the row averaging capacitors 714 because the pixels act as a direct voltage control for the column averaging capacitors 708.

Although the above-described process described the averaging of a single 3×3 block, a person skilled in the art will recognize that the circuit could also be used to average multiple blocks in any pattern on the array by employing the appropriate switching sequences. However, the blocks are preferably either square, or rectangular with the number of rows being less than the number of columns to use the above-described circuitry.

Another modification provides a differential readout, negating the need for the readout circuit 70 (of FIG. 3) to be used in every pixel cell. This has the advantage of increasing the photosensitive area of the cell. This is accomplished by providing two banks of row averaging capacitors 704, 704' in the row averaging section, as shown in FIG. 9 (second bank being depicted inside the dashed-line box). Reset bank 704', and a signal bank 704 are identical in configuration. Both banks 704, 704' are connected to the column averaging section 702. Bank 704' is connected through separate row averaging reset selection switches 712'. Each reset capacitor 714' in the reset bank 704' connected to a reset output line 720', through respective followers 722' and the output of each capacitor 714 in the signal bank 704 is ultimately connected to the output line 720. These output lines 720, 720' are, in turn, respectively connected to the inputs of a differential amplifier 726. The output of the differential amplifier 726 is connected to the aforementioned temporal averaging section or the multiplexer. Each of the row averaging capacitor banks 704, 704' in this modified row averaging section would operate identically to the single bank version described previously. However, the reset bank 704' is switched to the column averaging section 702 only after the pixel cells have been reset (i.e., as described in conjunction with FIG. 3A) and before any accumulated charge has been transferred to the floating diffusion node 40. Conversely, the signal bank 704 is switched to the column averaging section 702 once the accumulated charge has been transferred to the floating diffusion 40. In this way, the charge on each of the reset capacitors 714' represents the average reset value of a block and the charge on each of the capacitors 714 in the signal bank 704 represents the average signal value of the block. Thus, the difference of these two average values would represent the block average free of any kTC noise, for the reasons discussed previously.

It is noted that eliminating the readout circuit 70 (of FIG. 3A) would also eliminate the previously described advantageous feature of the invention which suppresses fixed pattern noise. Readout circuit 70 had a shorting FET 116 connected across the sampling capacitors 205, 235 to reduce the noise. The fixed pattern noise can also be suppressed by employing a similar strategy in the multiresolution circuit of FIG. 9. Crossbar switches 728 can be used in this circuit. These switches 728, when closed, connect the signal bank 704 with the reset bank 704'. The output from the differential amplifier 726 obtained when the crossbar switches 728 are closed is subtracted from the output obtained at the end of the integration period, before the switches 728 are closed. The result is a signal which has been compensated for fixed pattern noise.

Figure 10:
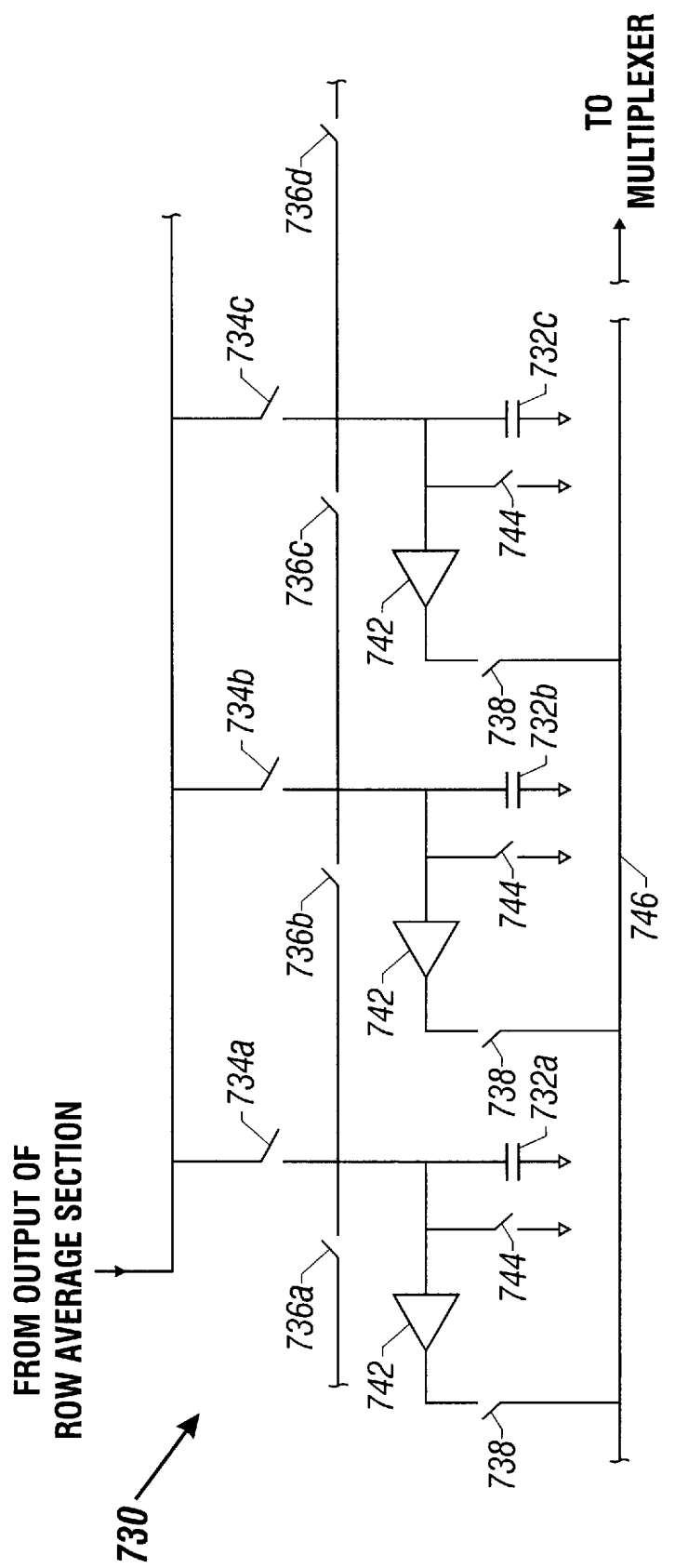
FIG. 10 is a schematic diagram of a temporal averaging circuit which can be incorporated in the circuit of FIG. 9.

FIG. 10 shows modifications to temporal averaging section 611. Temporal averaging capacitors 732 are connected to the row averaging section. While only a single bank is shown, a single or dual capacitor bank structure may be employed. A single bank structure would be used if the above-described modification to provide a differential output were not used. It could also be the case where the differential output circuit is used, but the signal output from the differential amplifier is fed into a single bank of temporal averaging capacitors 732. However, it can be beneficial to provide two independent banks of temporal averaging capacitors 732, respectively connected to the reset bank and signal bank of the aforementioned differential row averaging section. In this case, the reset and signal output signals from the row averaging section would not be connected to the differential amplifier. Instead, the reset and signal outputs from the two temporal averaging banks would be connected to this amplifier. The dual temporal averaging capacitor bank structure has the advantage of suppressing signal noise that might be generated within a single capacitor bank.

The following single bank description a is applicable to a dual bank structure. With a dual-bank structure the process is performed in both the reset (when the pixels have been reset) bank and the signal bank (after charge has been accumulated in the pixels), and then the output of each is differentially compared.

FIG. 10 shows a bank of temporal averaging capacitors 732 connected between the row averaging section and the multiplexer. The temporal averaging section 730 is configured like the row averaging section 704 (of FIG. 12) and also connected in a similar way to the way that the column averaging section 702 is connected to the row averaging section 704. It is noted, however, that no buffers 722 are preferably used in the row averaging section 730 when connected to the temporal averaging section 730.

The circuit shown in FIG. 10 will now be used to explain how three separate imager frames can be temporally averaged. Once the previously-described block averaging process is complete, the first temporal selection switch 734a is closed. This causes the output from the row averaging section to charge the first temporal averaging capacitor 732a. The other temporal selection switches 734b and 734c remain open during this transfer. This process is repeated once a block average has been determined for the next imager readout, but this time the second temporal selection switch 734b is closed while the others 734a and 734c remain open. This charges the second temporal averaging capacitor 732b. The process is repeated a third time for the next iteration, with the third temporal averaging capacitor 732c being charged by closing the third temporal selection switch 734c'. After all three of the temporal averaging capacitors 732a, 732b, and 732c have been individually charged, the charge is redistributed by pulsing the temporal averaging switches 736a, 736b, 736c, and 736d in the same pattern as the column averaging switches, i.e., the first 736a and fourth 736d are left open, while the second 736b and third 736c are toggled. This connection equalizes the charge between the capacitors 732a, 732b, and 732c, such that the voltage on each capacitor represents the average of the voltages originally held in them individually. Therefore, each of the temporal averaging capacitors 732 has a charge representative of the temporal average of three imager readout iterations. This temporal block average is readout to the multiplexer (or differential amplifier) by pulsing the temporal average output switch 738 of any one of the three temporal averaging capacitors 732. The temporal averaging capacitors 732 are buffered from the output line 740 by buffers 742. Charge sharing between the row and temporal averaging capacitors during the charge transfer step dictates that, an additional factor of one-half is preferably applied to the readout from the temporal averaging section 730.

The temporal averaging capacitors 732 can be reset by globally pulsing the temporal averaging reset switches 744.

Figure 11:
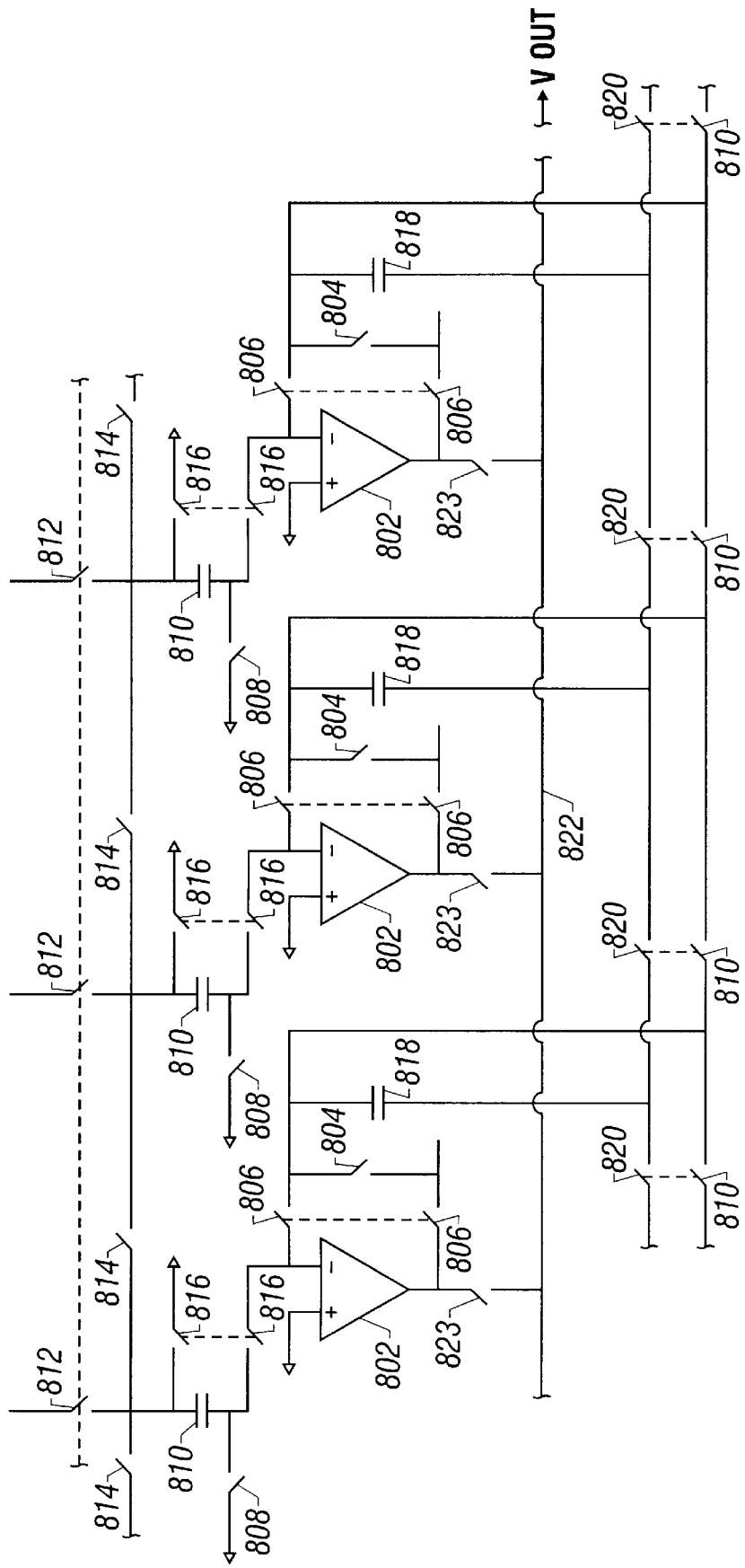
FIG. 11 is a schematic diagram of an alternate embodiment of the multiresolution imaging circuit associated with the architecture of FIG. 7

The second preferred implementation of the multiresolution readout circuitry uses a bank of switched capacitor integrators that are interconnected through a set of switches. By appropriately switching in additional capacitance from adjacent columns, switched capacitor charge integrators with variable integration gain are realized. These variable gain integrators at the bottom of each column are used for local averaging that proceeds in two steps. First, pixels in a given row of a block are averaged. Then, the respective rows of the block are averaged together. The integrators preferably receive differential input from the pixel signal and reset level, and in essence perform a correlated double sampling to suppress pixel kTC noise, 1/f noise, and fixed pattern noise due to threshold voltage variations. The basic circuit which produces the single-ended signal is shown in FIG. 11.

As before, subsequent to the signal integration period, each row of the array is read out in parallel. Prior to this readout, the operational amplifiers 802 are reset by pulsing the reset switches 804, as well as the pairs of ganged feedback capacitor switches 806. In the first half of each cycle of operation, the first column averaging capacitor switches 808 are closed to perform column averaging. Pixel cell output signals are sampled onto the column averaging capacitors 810 by globally pulsing the signal select switches 812. Charge is then redistributed on the column averaging capacitors 810 according to the desired block size, by enabling selected column averaging switches 814. For example, in reference to FIG. 14, a configuration of the column averaging switches 814 for averaging a 3×3 block pattern would require the first and fourth switches 814 too be left open, while the second and third switches 814 are closed.

Subsequently, the ganged second column averaging capacitor switches 816 are pulsed, transferring the charge to the first feedback capacitors 818. Selection of the first feedback capacitor 818 is done by closing only the first pair of ganged feedback capacitor switches 806. In each subsequent cycle (n cycles required for an n×n block), the column averaging and transfer process proceeds as just described for each row of the block. However, at the end of each subsequent cycle, selected ganged pairs of the row averaging switches 820 are pulsed. The row averaging switch pairs 820 selected are dependent on which cycle is currently being processed. For example, in the second cycle, the pair of row averaging switches 820 connected between the first and second feedback capacitors 818 are closed. Whereas, in the third cycle, these switches 820, as well as the row averaging switches 820 between the second and third capacitors 818 would be closed, and so on. The result of this process is that each of the feedback capacitors involved has a charge representing the block average after the last cycle is complete.

An output line 822 is connected to the node connecting the output of the operational amplifier 802 and the feedback capacitor 818 through an output switch 823. The block average is read out by pulsing the output switch 823 of one of the integrators. Note that in the implementation described above, in which the feedback capacitors 818 are switched in from neighboring columns, the blocks to be averaged are preferably either square or rectangular with the number of rows being less than the number of columns.

Figure 12:
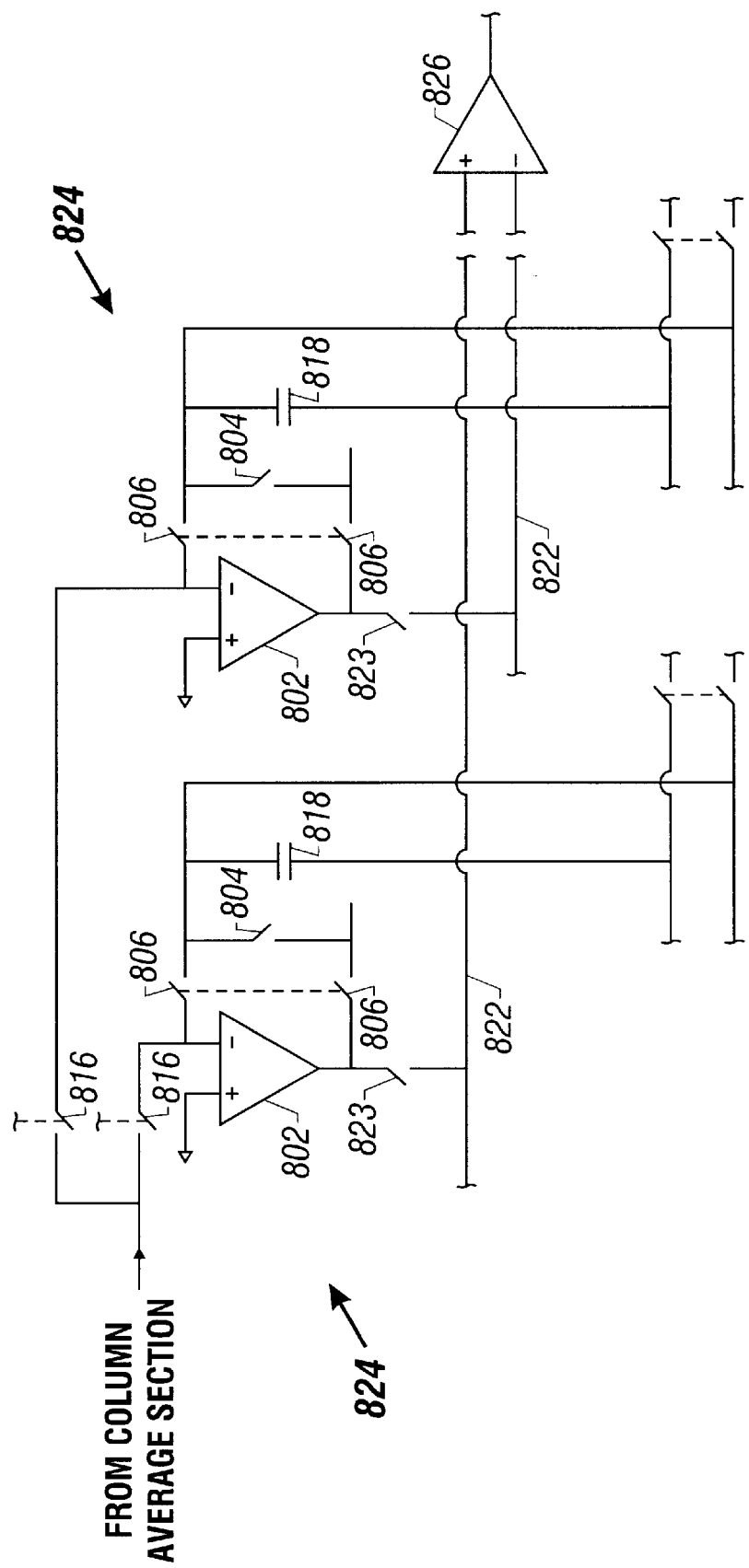
FIG. 12 is a schematic diagram of a modification to the alternate embodiment of the multiresolution imaging circuit of FIG. 4 which incorporates one version of a differential output.

In order to enhance noise performance, differential rather than single-ended pixel readout is preferred. A differential readout circuit is shown in FIG. 12. The modification adds an additional operational amplifier 802', feedback capacitor 818', reset switch 804', and feedback capacitor switch 806' to form a reset subcircuit 824' in parallel with the existing signal subcircuit 824. The subcircuits 824, 824' are connected to the column averaging section through separate second column averaging capacitor switches 816, 816'. Each of the feedback capacitor subcircuits 824, 824' operate identically to the single-ended version of the circuit described previously. The reset subcircuit 824' is switched to the column averaging section only after the pixel cells have been reset (i.e., as described in conjunction with FIG. 3A) and before any accumulated charge has been transferred to the floating diffusion node 40. Conversely, the signal subcircuit 824 would only be switched to the column averaging section once the accumulated charge has been transferred to the floating diffusion 40. In this way, the charge on each of the feedback capacitors 818' in the reset subcircuits 824' represent the average reset value of a block and the charge on each of the feedback capacitors 818 in the signal subcircuits 824 represent the average signal value of the block.

The output from the operational amplifier 802' of each reset subcircuit 824' is connected through an output switch 823' to a reset output line 822'. Likewise, the output of the operational amplifiers 802 of the signal subcircuit 824 are connected through a signal output switch 823 to a signal output line 822. These output lines 822, 822' are, in turn, respectively connected to the inputs of a differential amplifier 826. The output of the differential amplifier 826 is connected to the aforementioned temporal averaging section or the multiplexer. The differential output of the above-described modified circuit corrects for pixel induced variation (e.g., kTC noise), and also eliminates offsets in the bank of integrating operational amplifiers used in the row averaging section. In addition, switch feedthrough effects can also be canceled (to the first order) with this technique.

Figure 13:
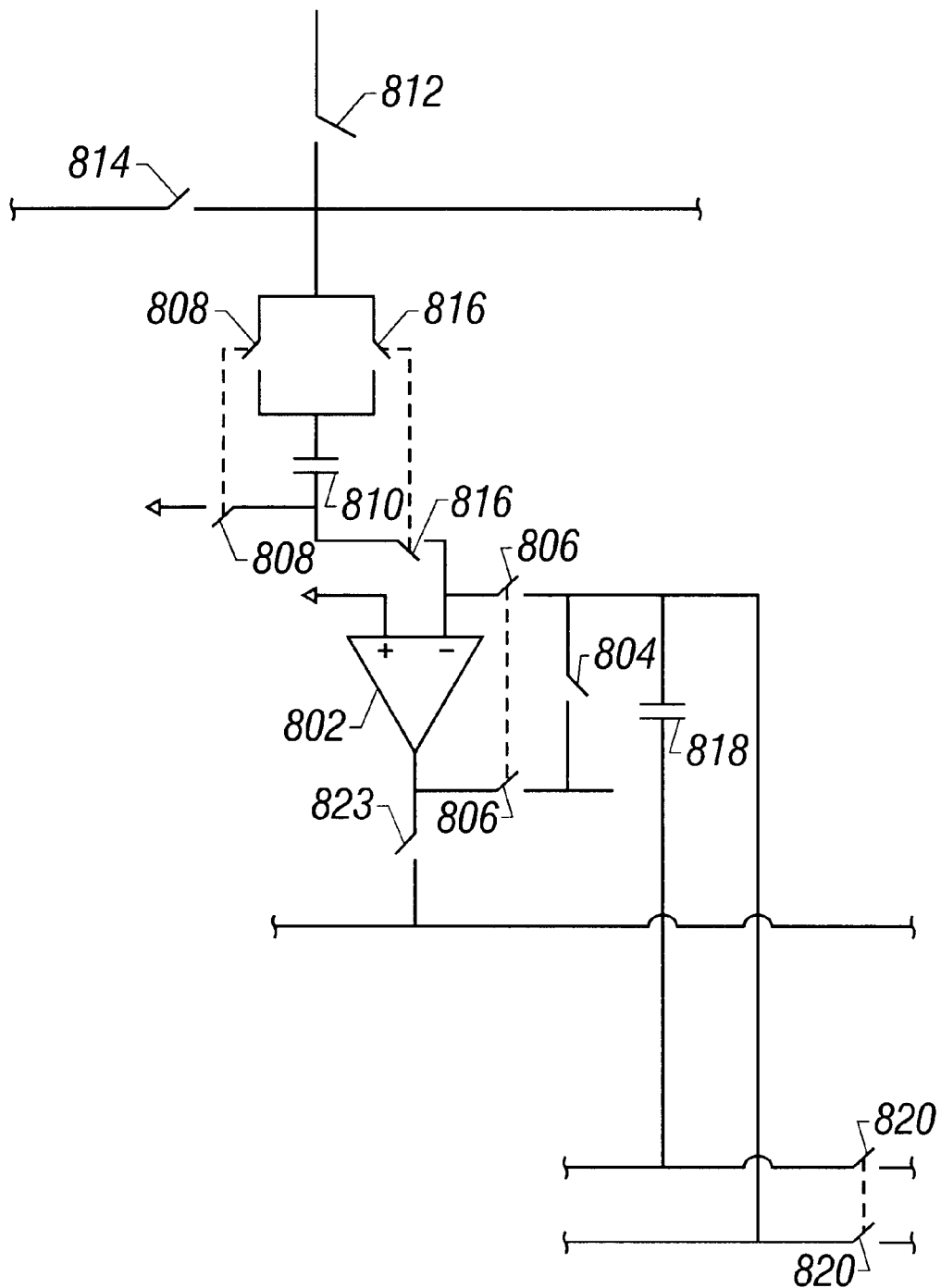
FIG. 13 is a schematic diagram of a modification to the alternate embodiment of the multiresolution imaging circuit of FIG. 4 which incorporates a second version of a differential output.

Another differential readout modification is shown in FIG. 13. Although only one of the capacitor integrator configurations is shown, the same change is made to all the integrators in the multiresolution circuit. The modified capacitor integrator configuration is operated in essentially the same manner as described above except that the pixel reset level is applied during the time the ganged first column averaging capacitor switches 808 are closed, while the pixel signal level is applied during the time the ganged second column averaging capacitor switches 816 are closed. The results of this altered procedure is to create a differential voltage (Vreset-Vsignal) across the feedback capacitor 818. Thus, the differential signal between the pixel signal and reset levels can be read out directly from the integrator. There is no need for the reset subcircuit 824' or the differential amplifier 826 of the previous embodiment (of FIG. 15).

If a temporal averaging section is desired, it could be incorporated as a single or dual bank structure as described in connection with the first preferred implementation of the multiresolution circuit. The only difference would be that the temporal averaging section would preferably be configured and operate like the row averaging section of the second preferred implementation of the multiresolution circuit (i.e., of FIGS. 14, 15 or 16).

The multiresolution readout circuits can be operated at video rates. This can be shown by the following analysis which compares the time it takes to provide an image output (i.e., one frame) at full resolution versus at a lower resolution.

If the processing of each row in the array takes "a" clock cycles, it would take (n×a) tc to process a row of blocks, assuming n×n blocks. In other words, n array rows would have to be processed to produce block averages for each block in the horizontal direction in the array. Next, if each block average is scanned out in "b" clock cycles, there would be m/n blocks in a row of blocks, assuming an m×m array. Therefore, it would take (m/n×b) tc to scan out an entire row of blocks. Process and output of one row of blocks, would take (n×a)+(m/n×b) tc. Thus, the total time to process and output one image frame would be m/n[(n×a)+(m/n×b)] tc because there are m/n rows of blocks in the array.

It is believed that in the above-described circuits, "a" will equal three clock cycles and "b" will equal one clock cycle. Accordingly, in a 512×512 array, the time to produce a full resolution image frame (i.e., n=1) would be 512[(3+512)] tc=263680 tc. However, if the array is downsampled by 4 so that 128×128 blocks are averaged, the time to produce the lower resolution image frame would be 512/4[(4×3)+(512/4)] tc=17920 tc. This constitutes about a 15 times reduction in the time it takes to produce the image. Assuming that tc=1 μs, it can be seen that the reduced resolution frame can be read out in 17.9 ms. Given that a typical video frame rate is approximately 30 ms, it can be seen that this image frame is obtained well within video frame rates, as desired. It is also noted that the frame rate is significantly faster than available using software-driven multiresolution systems.

Although, the modification of the previously disclosed active pixel sensor array to incorporate the column parallel multiresolution circuitry is the preferred way of implementing a multiresolution capability into a sensor array, it should be recognized that the concept can also be adapted for other types of arrays. For example, an array of photodiodes could employ the column parallel approach to provide multiresolution readout. In this case, the outputs of the photodiode pixels cells would be switched to the multiresolution circuitry and processed in the same manner. Employing the column parallel approach in a photodiode array in this manner would impart the same advantages. Among these are a minimization on the active circuitry required in each cell, which in turn, would maximize the fill factor.

Figure 14:
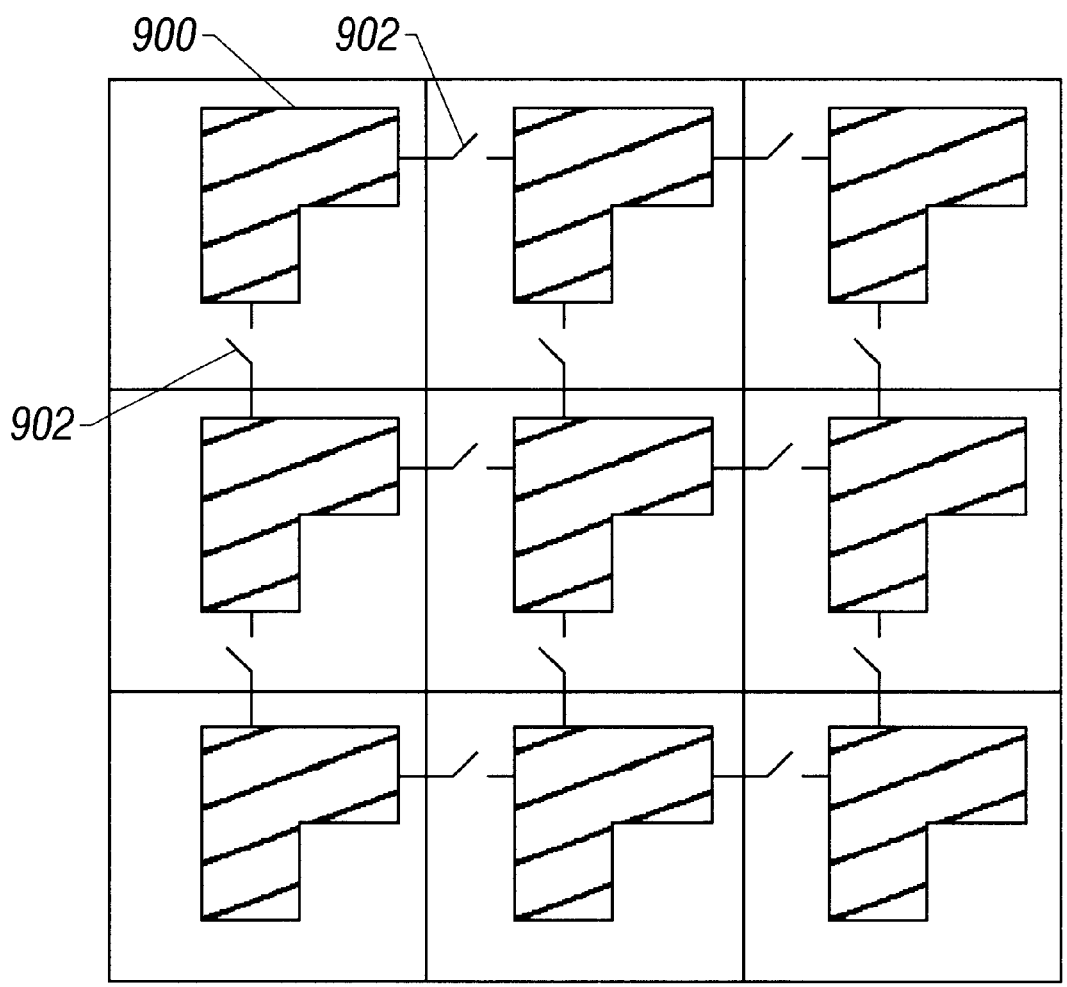
FIG. 14 is a diagram illustrating the architecture of an integrated circuit constituting a focal plane array of photodiodes with multiresolution imaging capability and employing a spatially parallel approach.

A photodiode array can also be used with a spatially parallel architecture (as opposed to a column parallel structure) to provide multiresolution capability. This alternate architecture can be used because it is possible to directly link the photodiode structures. FIG. 14 shows how the spatially parallel approach operates by connecting each photodiode 900 to its nearest neighbor through a set of programmable switches 902. Switches are also connected allowing each photodiode 900 to be switched to its diagonal neighbors, as well as its orthogonal neighbors. The net result of this switching capability is to allow the interconnection of groups of photodiodes to form the aforementioned blocks. It is noted that in the case of a spatially parallel architecture, the blocks can take on any configuration (e.g., rectangular, L-shaped, etc.), and would not be limited to being square or having fewer rows than columns, as in the case of the column parallel approach. In addition, blocks having differing shapes and sizes can be formed in different areas of the array for each frame. For example, one part of the array could remain unblocked so that a high resolution image of that area could be obtained, while another area where lower resolution image is acceptable could be block averaged.

Switching together the photodiode structures 900 of a group of pixels in the array once a photo-generated charge has been accumulated has the effect of averaging the signal output by the photodiodes 900. This occurs because the actively photosensitive surface area of each photodiode 900 in an array is typically the same and the capacitance of a photodiode 900 increases linearly with its photosensitive surface area. Thus, as more photodiodes 900 are switched together the overall capacitance of the "superpixel" block increases to a similar degree. For example, in a 3×3 block, the overall block capacitance would be nine times that of an individual photodiode 900 in the array. In addition, the voltage output by a photodiode 900 is equal to the accumulated charge divided by its capacitance. When the photodiodes 900 in a block are interconnected after the integration period, the voltage output by the block becomes the sum of the accumulated charge of each photodiode 900 divided by the photodiode capacitance (which would be the same for each photodiode in the block) times the number of photodiodes 900 in the block. Thus, the voltage of the signal output by the interconnected photodiodes 900 will represent the average of the voltage signals that would have been output from the photodiode individually.

Figure 15:
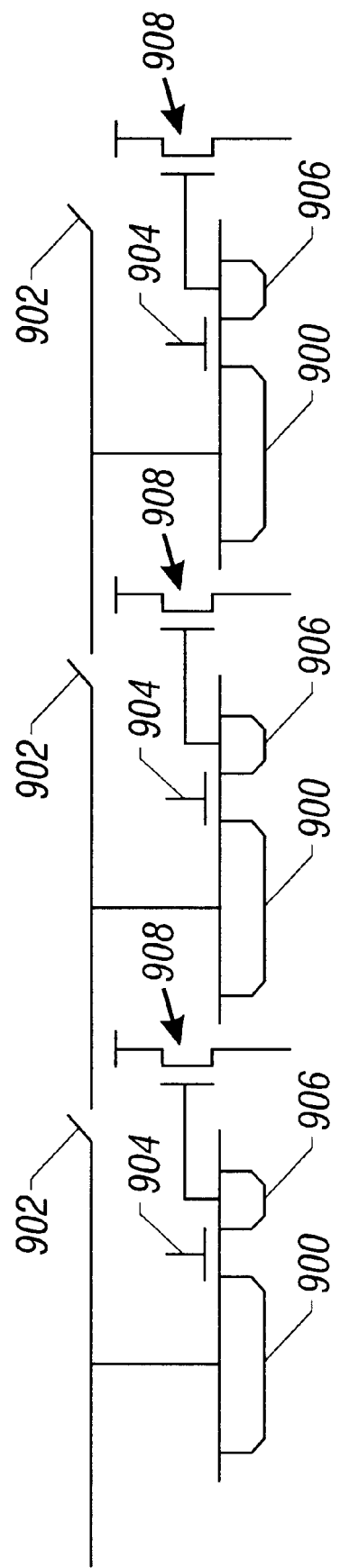
FIG. 15 is a schematic diagram of an alternate embodiment of the architecture of FIG. 14 incorporating a low light imaging capability.

Another application of a spatially parallel network of interconnected photodiodes 900 is in low light level imaging. FIG. 15 shows a transfer gate 904 is utilized between the photodiode 900 and a floating diffusion 906. Floating diffusion 906 has a small surface area in comparison to the photodiode 900. When low light conditions are encountered, detector area is increased by switching in neighboring photodiodes via the programmable switches 902 to create a larger "superpixel", just as before. The block of interconnected photodiodes is read out through a single floating diffusion output node 908 by pulsing only one transfer gate 904 within the block, rather than directly from the interconnected photodiodes 900. Pulsing the transfer gate 904 essentially changes the capacitance of the block to the capacitance of the floating diffusion 906, rather than the larger combined capacitance of the interconnected photodiodes 900. The accumulated charge remains the same, but the capacitance is reduced significantly, the voltage read from the floating diffusion 906 will be considerably larger than could be obtained by reading the interconnected photodiodes 900, or any one photodiode 900, directly. Accordingly, sensitivity is achieved (i.e., the enhanced voltage signal from the block) at the expense of resolution (i.e., due to the block averaging that takes place when the photodiodes 900 are interconnected).

While the invention has been described in detail by reference to the preferred embodiment described above, it is understood that variations and modifications thereof may be made without departing from the true spirit and scope of the invention. For example, the switched capacitor integrators described in connection with the second preferred implementation of the multiresolution readout circuit could be replaced with switched capacitor filters. The switched capacitor filters would be designed to perform a low pass filtering and pixel weighting operation instead of just simple signal averaging. In this way, a more sophisticated block processing procedure can be realized.

What is claimed is:

1. A multiresolution imaging device comprising:

a focal plane array of CMOS active pixel cells monolithically formed on a semiconductor substrate, wherein each of the cells includes a photosensing element operable to generate electrical charge in response to an image scene, a charge coupled device section adjacent to said photosensing element having a sensing node and a charge coupling stage for transferring said charge from said photosensing element to said sensing node, a readout circuit connected to said sensing node and configured to have at least one output transistor for producing an image signal output indicative of said image scene; and a multiresolution circuit formed on said substrate, connectable to each one of said cells for processing the image signal output from each one of a group of cells forming a contiguous block within the array and operable to vary a number of cells in said contiguous block to produce different output resolutions.

2. The image device of claim 1, wherein the multiresolution circuit comprises:

a block average element operable to combine and average the image signals output from the cells forming said block to produce a block average; and a block average output element outputting a signal representative of the block average.

3. The image device of claim 1, wherein the multiresolution circuit includes an element operating to process the image signals associated with more than one block within the array.

4. The image device of claim 1, wherein the focal plane array of cells is organized by rows and columns of said cells, and wherein the multiresolution circuit is capable of being simultaneously connected to at least two cells within a row of the array.

5. The image device of claim 1, wherein said photosensing element in each of said cells includes a photodiode operating in either a current mode or a voltage mode.

6. The image device of claim 1, wherein the focal plane array of cells further comprises:

a reset element connected to each sensing node and configured to periodically reset a potential of said sensing node to a predetermined potential to produce a reset signal from the sensing node.

7. The image device of claim 6, wherein the multiresolution circuit further comprises:

a reset average element connected to combine and average the reset signals from the cells forming said block to produce a block reset average.

8. The image device of claim 1, wherein the image signal output by the cells of the focal plane array is a succession of discrete image readouts, each readout representing the image scene captured by said focal plane array at a different time, further comprising an element connected and configured to combine and average image signals output from the cells of a block to produce a block average for each image readout and wherein the multiresolution circuit further comprises:

a temporal average element connected and configured to combine and average the block averages produced in a prescribed number of consecutive image readouts to produce a temporal block average; and an output element connected and configured to output a signal representative of the temporal block average.

9. A multiresolution imaging device comprising:

a focal plane array of CMOS active pixel cells monolithically formed on a semiconductor substrate and arranged relative to one another in rows and columns, wherein each of the cells includes a photosensing element operable to generate electrical charge in response to an image scene, a charge coupled device section adjacent to said photosensing element having a sensing node and a charge coupling stage for transferring said charge from said photosensing element to said sensing node, a readout circuit connected to said sensing node and configured to have at least one output transistor for producing an image signal output indicative of said image scene;

a multiresolution circuit formed on said substrate, connectable to each cell for processing the image signal output from each one of a group of cells forming a contiguous block within the array and operable to vary a number of cells in said continuous block to produce different output resolutions, wherein the multiresolution circuit is capable of being simultaneously connected to at least two cells in a row of the array and comprises:

a column averaging element, operating to combine and average the image signal outputs from a predetermined number of consecutive cells within the row of the array, wherein said predetermined number of consecutive cells constitutes a row of a block of cells and said combining and averaging produces an average for the row of the block; and a row averaging element comprising, a storage element operable to receive and store averages for consecutive rows of the block of cells from the column averaging element, and a processing element operable to combine and average said stored averages, thereby producing a block average.

10. The image device of claim 9, wherein the image signal output by the cells of the focal plane array comprises a succession of discrete image readouts, each readout representing the image scene captured by said focal plane array at a different time and the multiresolution circuit further comprises:

a temporal averaging element comprising, a storage unit configured and connected to receive and store block averages from the row averaging element after each consecutive image readout, and a temporal block average unit configured and connected to combine and average said stored block averages for a prescribed number of image readouts, thereby producing a temporal block average.

11. An image device, comprising:

a focal plane array of pixel cells wherein each cell responds to an input image and has a sensing node which outputs an image signal;

a multiresolution circuit connectable to each one of said cells for processing the image signal output from each one of a group of cells forming a contiguous block within the array;

a block average element configured to combine and average signals from said block to produce a block average;

a reset element connected to each sensing node and configured to periodically reset a potential of said sensing node to a predetermined potential to produce a reset signal from said sensing node;

a reset average element configured to combine and average the reset signals from the cells forming said block to produce a block reset average;

a comparing element configured and connected to differentially compare the block average and the block reset average to produce a differential block average; and an output element connected to output a signal representative of the differential block average.

12. An imaging device comprising:

a focal plane array of CMOS active pixel cells monolithically formed on a semiconductor substrate, wherein each one of the cells includes a photosensing element operable to generate electrical charge in response to an image scene, a charge coupled device section adjacent to said photosensing element having a sensing node and a charge coupling stage for transferring said charge from said photosensing element to said sensing node, a readout circuit connected to said sensing node and configured to have at least one output transistor for producing an image signal output indicative of said image scene; and a multiresolution circuit interconnecting adjacent photosensing elements so as to form a contiguous block within the array and produce a combined output image signal, said combined output image signal representing an average of the image signals output by each of the photosensing elements in the block.

13. The imaging device of claim 12, wherein the multiresolution circuit is capable of simultaneously forming more than one block within the array, each block being any prescribed shape and size.

14. The imaging device of claim 13, wherein said photosensing element in each of said cells includes a photodiode.

15. A low light imaging device comprising:

a monolithic semiconductor integrated circuit substrate;

a focal plane array of CMOS active pixel cells formed on said substrate, each one of said pixel cells comprising, a photodiode formed within the substrate, a floating diffusion disposed and configured to receive electrical charge from said photodiode, a readout circuit connected to the floating diffusion, and a transfer gate overlying the substrate between said floating diffusion and the photodiode; and interconnecting circuit operating to interconnect adjacent photodiodes so as to form a contiguous block within the array.

16. The imaging device of claim 15, wherein the interconnecting circuit is capable of simultaneously forming more than one block within the array, each block being any prescribed shape and size.

17. The imaging device as in claim 15, wherein a single floating diffusion in one of the cells in said contiguous block is pulsed to read out accumulated charge in said contiguous block, thus reducing an effective output capacitance.

18. A method of performing multiresolution imaging comprising:

providing a focal plane array of CMOS active pixel cells formed on a monolithic substrate, each cell including a photosensing element, a charge coupled device section adjacent to said photosensing element having a sensing node and a charge coupling stage for transferring electrical charge from said photosensing element to said sensing node, a readout circuit connected to said sensing node and configured to have at least one output transistor;

using said array to capture an image scene;

connecting a group of cells to form a contiguous block within the array;

combining and averaging image signals output from the cells forming said block to produce a block average; and, outputting a signal representative of the block average.

19. The method of claim 18, further comprising forming plural blocks and a block average for each of said blocks.

20. The method of claim 18, wherein the focal plane array of cells is organized by rows and columns of said cells, and wherein the step of connecting a group of cells to form a contiguous block within the array comprises the steps of:

simultaneously connecting at least two cells within a row of the array;

combining and averaging the image signal outputs from a predetermined number of consecutive cells within a row of the array, wherein said predetermined number of consecutive cells constitutes a row of a block of cells and said combining and averaging produces an average for the row of the block;

receiving and storing averages for consecutive rows of the block of cells; and combining and averaging said stored averages, thereby producing said block average.

21. The method of claim 20, further comprising:

periodically resetting a potential of said sensing node to a predetermined potential to produce a reset signal from the sensing node;

combining and averaging the reset signals from the cells forming said block to produce a block reset average;

differentially comparing the block average and the block reset average to produce a differential block average; and, outputting a signal representative of the differential block average.

22. The method of claim 21, wherein the image signal output by the cells of the focal plane array is a succession of discrete image readouts, each readout representing the scene viewed by the image device at a different time, and further comprising:

combining and averaging the block averages produced in a prescribed number of consecutive image readouts to produce a temporal block average; and outputting a signal representative of the temporal block average.

* * * * *